United States Patent
Fujita et al.

[11] Patent Number: 6,146,775
[45] Date of Patent: Nov. 14, 2000

[54] MAGNETORESISTIVE FILM

[75] Inventors: Masayuki Fujita, Kyoto; Atsushi Maeda, Osaka; Satoru Oikawa, Yao; Koji Yamano, Hirakata; Minoru Kume, Shijyounawate, all of Japan

[73] Assignee: Sanyo Electric Co., Ltd., Osaka, Japan

[21] Appl. No.: 08/972,212

[22] Filed: Nov. 17, 1997

[30] Foreign Application Priority Data

Nov. 18, 1996 [JP] Japan ................................. 8-306736
Jun. 27, 1997 [JP] Japan ................................. 9-171781

[51] Int. Cl.$^7$ ............................................. G11B 5/60
[52] U.S. Cl. ................ 428/692; 428/694 R; 428/694 T; 428/694 TM; 428/694 TS; 428/900; 360/113; 324/252
[58] Field of Search ............................ 428/692, 694 R, 428/694 T, 694 TM, 694 TS; 360/113; 324/252

[56] References Cited

U.S. PATENT DOCUMENTS

| | | | |
|---|---|---|---|
| 5,373,238 | 12/1994 | McGuire | 324/252 |
| 5,549,978 | 8/1996 | Iwsaski | 428/692 |
| 5,552,949 | 9/1996 | Hashimoto et al. | 360/327.32 |
| 5,768,067 | 6/1998 | Saito | 360/327.32 |
| 5,862,022 | 1/1999 | Noguchi | 360/324.2 |
| 5,869,963 | 2/1999 | Saito | 324/252 |
| 5,874,886 | 2/1999 | Araki | 338/32 R |
| 5,910,344 | 6/1999 | Masegawa | 427/599 |

FOREIGN PATENT DOCUMENTS 8-087722  4/1996  Japan.

Primary Examiner—Leszek Kiliman
Attorney, Agent, or Firm—W. F. Fasse; W. G. Fasse

[57] ABSTRACT

A magnetoresistive film is disclosed which has a layered structure comprising a first ferromagnetic layer, a second ferromagnetic layer, a nonmagnetic conductive layer interposed between the first and second ferromagnetic layers, and an antiferromagnetic layer coupled with one of the first and second ferromagnetic layers. The antiferromagnetic layer comprises an antiferromagnetic material selected from an antimony-base alloy, fluoride, an FeRh-base alloy, FeS, an IrMnCo-base alloy and a CrAl-base alloy.

45 Claims, 28 Drawing Sheets

FIG. 33

| Ta | 49 |
| IrMnCo | 48 |
| Co | 47 |
| Cu | 46 |
| Co | 45 |
| Ta | 44 |
| Substrate | 43 |

MAGNETORESISTIVE FILM

BACKGROUND OF THE INVENTION

1. Field of the Invention

The present invention relates to a magnetoresistive film, and more particularly to a magnetoresistive film having a spin valve structure.

2. Description of Related Art

A magnetoresistive element (MR element) is an element which measures a magnetic field strength and its variations by detecting changes in electric resistance of a magnetoresistive film in response to an applied magnetic field. A reproduce head (MR head) incorporating such a magnetoresistive element offers a higher magnetic sensitivity relative to conventional inductive heads, and its application to a reproduce head for hard disk drives has been widely investigated. The enhanced magnetic sensitivity of such an MR head serves to push an areal recording limits. Accordingly, increased efforts have been recently made to develop a magnetoresistive film which exhibits a high MR ratio that can be associated with the improved sensitivity.

A giant magnetoresistive element (GMR element) is known as exhibiting a high MR ratio. As one example of such a GMR element, a spin valve film is known which has a multilayer structure consisting of antiferromagnetic/ferromagnetic/nonmagnetic conductive/ferromagnetic layers. One known specific spin valve film has an FeMn/NiFe/Co/Cu/Co/NiFe multilayer structure. In the spin valve films having such a multilayer structure, the FeMn antiferromagnetic layer is strongly exchange coupled to the NiFe layer formed thereon while the NiFe layer is ferromagnetically coupled to the Co layer. As a result, one of the ferromagnetic layers is pinned by the antiferromagnetic layer. Accordingly, as a magnetization direction of another ferromagnetic layer changes in response to a varied external magnetic field, a marked change in MR ratio is caused. Thus, the enhanced magnetic sensitivity can be obtained by the use of such a spin valve film.

However, FeMn employed for the conventional antiferromagnetic layer is susceptible to corrosion, and produces corrosion pits (micropores) after passed through a polishing process generally using water. This results in an undesirable degradation of magnetoresistive characteristics.

SUMMARY OF THE INVENTION

It is an object of the present invention to provide a magnetoresistive film which can resolve the conventional problems noted above and exhibits a giant magnetoresistance as well as an enhanced corrosion resistance.

A magnetoresistive film in accordance with a first aspect of the present invention has a layered structure which comprises a first ferromagnetic layer, a second ferromagnetic layer, a nonmagnetic conductive layer interposed between the first and second ferromagnetic layers, and an antiferromagnetic layer coupled with (provided on) one of the first and second ferromagnetic layers, which antiferromagnetic layer comprises an antiferromagnetic antimony-base alloy.

The antiferromagnetic antimony-base alloys include CrSb, $FeSb_2$ or $(Mn_XCr_{1-X})_YSb_{100-Y}$ ($0 \leq X \leq 0.3$, $40 \leq Y \leq 60$), for example.

A magnetoresistive film in accordance with a second aspect of the present invention has a layered structure which comprises a first ferromagnetic layer, a second ferromagnetic layer, a nonmagnetic conductive layer interposed between the first and second ferromagnetic layers, and an antiferromagnetic layer coupled with one of the first and second ferromagnetic layers, which antiferromagnetic layer comprises an antiferromagnetic fluoride.

The antiferromagnetic fluorides include $CoF_3$ and $FeF_3$, for example.

A magnetoresistive film in accordance with a third aspect of the present invention has a layered structure which comprises a first ferromagnetic layer, a second ferromagnetic layer, a nonmagnetic conductive layer interposed between the first and second ferromagnetic layers, and an antiferromagnetic layer coupled with one of the first and second ferromagnetic layers, which antiferromagnetic layer comprises an FeRh-base alloy.

Illustrative of the FeRh-base alloy is $Fe_XRh_{100-X}$ ($40 \leq X \leq 60$), for example.

Also, the FeRh-base alloy may contain at least one metallic element selected from the group consisting of Pt, Ir, Pd, Zr, Nb, Mo, Ru, Hf, Ta, W, Re and Os. The content of such an additive element in the FeRh-base alloy is preferably not greater than 30 atomic percent.

Examples of the FeRh-base alloys containing the additive element include $Fe_X(Rh_{1-Y}Pt_Y)_{100-X}$ ($40 \leq X \leq 60$, $0 < Y \leq 0.5$), $Fe_X(Rh_{1-Y}Ir_Y)_{100-X}$ ($40 \leq X \leq 60$, $0 < Y \leq 0.5$) and $Fe_X(Rh_{1-Y}Pd_Y)_{100-X}$ ($40 \leq X \leq 60$, $0 < Y \leq 0.5$).

A specific example of the FeRh-base alloy has a composition of $Fe_{50}Rh_{50-X}Pd_X$ ($X \leq 30$).

The value of X in the $Fe_{50}Rh_{50-X}Pd_X$ alloy composition is preferably in the range of 10–25, more preferably in the range of 15–20. The alloys having such compositions exhibit a high Neel temperature and is accordingly able to impart an improved heat-resistance to magnetoresistive films.

A magnetoresistive film in accordance with a fourth aspect of the present invention has a layered structure which comprises a first ferromagnetic layer, a second ferromagnetic layer, a nonmagnetic conductive layer interposed between the first and second ferromagnetic layers, and an antiferromagnetic layer coupled with one of the first and second ferromagnetic layers, which antiferromagnetic layer comprises FeS.

A magnetoresistive film in accordance with a fifth aspect of the present invention has a layered structure which comprises a first ferromagnetic layer, a second ferromagnetic layer, a nonmagnetic conductive layer interposed between the first and second ferromagnetic layers, and an antiferromagnetic layer coupled with one of the first and second ferromagnetic layers, which antiferromagnetic layer comprises an IrMnCo-base alloy.

The IrMnCo-base alloy may be $(IrMn)_{100-X}Co_X$ ($0 < X \leq 30$), specifically $(Ir_{25}Mn_{75})_{100-X}Co_X$ ($0 < X \leq 30$), for example. A further preferred value of X is in the range of $0.1 \leq X \leq 20$.

A magnetoresistive film in accordance with a sixth aspect of the present invention has a layered structure which comprises a first ferromagnetic layer, a second ferromagnetic layer, a nonmagnetic conductive layer interposed between the first and second ferromagnetic layers, and an antiferromagnetic layer coupled with one of the first and second ferromagnetic layers, which antiferromagnetic layer comprises a CrAl-base alloy.

The CrAl-base alloy may be $Cr_XAl_{100-X}$ ($50 \leq X \leq 80$), for example.

In the present invention, if an antiferromagnetic layer is disposed toward a substrate, it is preferred to provide, as an underlayer for the antiferromagnetic layer, at least one metallic layer selected from the Group IVa, Group Va and Group VIa metals of the periodic table, or a nonmagnetic metallic layer having a bcc (body-centered cubic) crystal structure. The Group IVa, Group Va and Group VIa metals of the periodic table include Ti, Zr, Hf, V, Nb, Ta, Cr, Mo and W, for example. These metallic layers exhibit satisfactory wettabilities to antiferromagnetic layer materials employed in the above-described first through fourth aspects of the present invention. These metallic layers are not limited to those having a crystalline structure, and may be amorphous metallic layers.

The nonmagnetic metallic layers having a bcc (body-centered cubic) crystal structure include Cr and Fe, for example. The formation of the present antiferromagnetic layer such as on a Cr layer can impart a more desirable crystal structure and improved magnetic characteristics to the antiferromagnetic layer. In particular, if the antiferromagnetic layer has a bcc (body-centered cubic) crystal structure or a bct (body-centered tetragonal) crystal structure, the provision of the underlayer formed of a material having a bcc (body-centered cubic) crystal structure allows the antiferromagnetic layer to have a crystal structure which exhibits a large exchange coupling to the ferromagnetic layer, and thereby imparting stable magnetic characteristics to the antiferromagnetic layer.

As such, a magnetoresistive film in accordance with a seventh aspect of the present invention has a layered structure which includes a first ferromagnetic layer, a second ferromagnetic layer, a nonmagnetic conductive layer interposed between the first and second ferromagnetic layers, an antiferromagnetic layer coupled with one of the first and second ferromagnetic layers and comprised of a material having a body-centered cubic (bcc) or tetragonal (bct) structure, and an underlayer provided beneath the antiferromagnetic layer and comprised of a material having a body-centered cubic structure.

A magnetoresistive element in accordance with an eighth aspect of the present invention includes a magnetoresistive film and a domain control film having a layered structure for controlling a magnetic domain of the magnetoresistive film. The layered structure includes an antiferromagnetic layer comprised of a material having a body-centered cubic (bcc) or tetragonal (bct) structure, a ferromagnetic layer provided on the antiferromagnetic layer, and an underlayer provided beneath the antiferromagnetic layer and comprised of a material having a body-centered cubic structure.

In a preferred embodiment in accordance with the above eighth aspect, the magnetoresistive film in the above-described magnetoresistive element is identical to the magnetoresistive film in accordance with the above seventh aspect. The underlayers, respectively, in the magnetoresistive film and the domain control film are formed of the same material while the antiferromagnetic layers, respectively, in the magnetoresistive film and the domain control film are formed of the same material.

In the above-described seventh and eighth aspects, the underlayer may be formed of Cr; an alloy of Cr and at least one element selected from Ta, Zr, Nb, fe, W, V, Mo, Hf, Cs and Rb; Ta; or an alloy of Ta and at least one element selected from Zr and Nb, for example.

In the above-described seventh and eighth aspects, the antiferromagnetic layer may be formed of an alloy of at least one element selected from Fe, Mn and Cr, and at least one element selected from Rh, Pd, Co, Ir, Pt, Ni, Sb and F, for example.

In the above-described seventh and eighth aspects, the underlayer preferably has a (100) plane as its preferentially oriented crystal plane.

Also, in the above-described seventh and eighth aspects, it is preferred that a preferentially oriented crystals plane of the antiferromagnetic layer is a (100) plane or a (001) plane. Such a preferentially oriented crystal plane, i.e., the (100) or (001) plane, of the antiferromagnetic layer can be readily realized if the underlayer is preferentially oriented in the (100) plane.

In the above-described seventh and eighth aspects, it is particularly preferred that the underlayer is formed of Cr and the antiferromagnetic layer is formed of an FeRh-base alloy. The FhRh-base alloys includes Ferh, and alloys of FhRh and at least one element selected from Pd, Co, Ir, Pt, Ni, Sb and F, for example.

The common matters in the first through eighth aspects of the present invention may be hereinafter explained inclusively as the matters of the "present invention".

A thickness of the antiferromagnetic layer in the present invention is not particularly limited, but is generally in the range of 5–100 nm, preferably in the range of 5–25 nm.

The material type of the ferromagnetic layer employed in the present invention is not particularly limited, so long as the ferromagnetic layer is formed of a ferromagnetic material whose Curie temperature is above an element operating temperature. The ferromagnetic layer may be an NiFe layer, a Co layer, or a two-layer film combining the NiFe layer with the Co layer, for example. The ferromagnetic layer may also be selected from alloys thereof. A thickness of the ferromagnetic layer is generally in the range of 1–10 nm.

Any material can be employed for the nonmagnetic conductive layer in the present invention, so long as it is nonmagnetic at an element operating temperature and exhibits an excellent electric conductivity. The nonmagnetic conductive layer may be a Cu layer or an Ag layer, for example. A thickness of the nonmagnetic conductive layer is generally in the range of 1–5 nm.

A thickness of the underlayer in the present invention, if provided beneath the antiferromagnetic layer, is generally in the range of 1–50 nm, preferably in the range of 1–20 nm.

The magnetoresistive film of the present invention is generally provided on a substrate. Any material can be employed for the substrate, so long as it is nonmagnetic. Examples of the substrate materials include Si, TiC, $Al_2O_3$, and glass.

Since the materials employed for the antiferromagnetic layer in the magnetoresistive film of the present invention respectively exhibit excellent corrosion resistances, the magnetoresistive film of the present invention exhibit a giant magnetoresistance as well as an excellent corrosion resistance. Consequently, the magnetoresistive film can be protected against corrosion, e.g. in its fabricating process, to exhibit excellent magnetoresistive characteristics.

In accordance with the seventh and eighth aspects of the present invention, the underlayer is formed of a material having a body-centered cubic structure while the antiferromagnetic layer is formed of a material having a body-centered cubic or tetragonal structure, which allows the antiferromagnetic layer to have a crystal orientation that favorably acts to enhance exchange coupling between the ferromagnetic and antiferromagnetic layers. The enhanced exchange coupling between the ferromagnetic and antiferromagnetic layers serves to impart stable and excellent magnetoresistive characteristics to the magnetoresistive film.

BRIEF DESCRIPTION OF THE DRAWINGS

FIG. 33 is a cross-sectional view showing one embodiment of a magnetoresistive film in accordance with a sixth aspect of the present invention;

DESCRIPTION OF THE PREFERRED EMBODIMENTS

Figure 1:
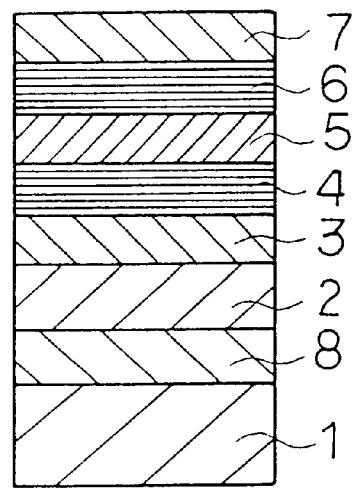
FIG. 1 is a cross-sectional view showing one embodiment of a magnetoresistive film in accordance with a first aspect of the present invention.

FIG. 1 is a cross-sectional view of one magnetoresistive film embodiment in accordance with a first aspect of the present invention. Referring to FIG. 1, an underlayer 8 (film thickness: 5 nm) such as of Cr is formed on a glass substrate 1. Formed on the underlayer 8 is an antiferromagnetic layer 2 (film thickness: 15 nm) of an antiferromagnetic material which is an antimony-base alloy in this embodiment. Formed on the antiferromagnetic layer 2 are an NiFe layer 3 (film thickness: 3 nm), a Co layer 4 (film thickness: 0.6 nm), a Cu layer 5 (film thickness: 2 nm), a Co layer 6 (film thickness: 0.6 nm) and an NiFe layer 7 (film thickness: 3 nm) in such a stacked order. In this particular embodiment, each of the NiFe layers 3, 7 is formed of $Ni_{80}Fe_{20}$.

A first ferromagnetic layer includes the NiFe layer 3 and the Co layer 4. The Cu layer 5 as a nonmagnetic conductive layer is formed on the first ferromagnetic layer. Formed on the Cu layer 5 is a second ferromagnetic layer which includes the Co layer 6 and the NiFe layer 7.

The antiferromagnetic layer 2 is strongly exchange coupled to the NiFe layer 3 and Co layer 4, and the NiFe layer 3 and Co layer 4 are in a so-called pinned state. If an external magnetic field is either absent or weakly applied, a magnetization direction of the second ferromagnetic layer including the Co layer 6 and the NiFe layer 7 is set parallel to that of the first ferromagnetic layer including the NiFe layer 3 and the Co layer 4. When a strong external field is subsequently applied in an antiparallel direction, the magnetization of the second ferromagnetic layer including the Co layer 6 and the NiFe layer 7 is brought into an antiparallel orientation. As such a change occurs, a marked variation in a MR ratio is observed. Accordingly, the magnetoresistive film as shown in FIG. 1 now defines a spin valve magnetoresistive film.

The Cr layer 8 is an underlayer for the antiferromagnetic layer 2. The provision of the antiferromagnetic layer 2 on such an underlayer 8 serves to impart improved film properties to the antiferromagnetic layer 2. The underlayer 8 may be formed of a metallic element in Group IVa, Group Va and Group VI of the periodic table, e.g., Zr, Ta or Hf.

Figure 2:
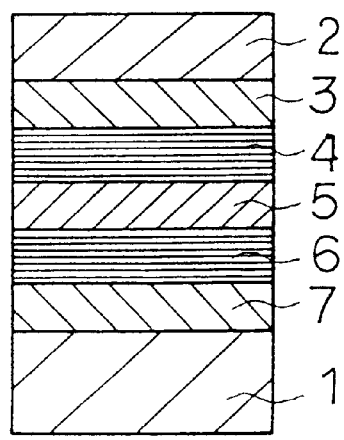
FIG. 2 is a cross-sectional view showing another embodiment of a magnetoresistive film in accordance with the first aspect of the present invention.

FIG. 2 is a cross-sectional view of another magnetoresistive film embodiment in accordance with the first aspect of the present invention. In this embodiment, the antiferromagnetic layer 2 in the magnetoresistive film is distanced from the substrate 1 to define an upper-most layer. As illustrated in FIG. 2, formed on the glass substrate 1 are the NiFe layer 7, Co layer 6, Cu layer 5, Co layer 4 and NiFe layer 3 in such a stacked order. On the NiFe layer 3 is formed the antiferromagnetic layer 2 of an antiferromagnetic material which is an antimony-base alloy in this embodiment. The film thickness of each layer is substantially identical to that of the corresponding layer of the embodiment as shown in FIG. 1. In the present invention, the stacked order of those layers 2 through 7 in the magnetoresistive film embodiment of FIG. 1 can be reversed to provide the embodiment as shown in FIG. 2.

A technique of forming a thin film for each layer incorporated in the magnetoresistive films shown in FIGS. 1 and 2 is not particularly limited, and can be ion beam sputtering, for example.

Evaluation was subsequently made for specific magnetoresistive films shown in FIGS. 1 and 2. Three types of antiferromagnetic material, i.e., CrSb, $FeSb_2$ and $(Mn_{0.2}Cr_{0.8})_{50}Sb_{50}$, were used for the antiferromagnetic layer 2 to prepare the respective magnetoresistive films. The magnetoresistive films of FIGS. 1 and 2 exhibited a comparable or superior degree of MR characteristics relative to a conventional magnetoresistive film which incorporated an FeMn layer as the antiferromagnetic layer 2.

Also, the magnetoresistive film embodiments of FIGS. 1 and 2 as well as the conventional magnetoresistive film were respectively subjected to heat treatment at 260° C. for 10 hours for evaluation of MR characteristics after heat treatment. The results demonstrated that a degree of reduction in MR characteristics of the magnetoresistive film embodiments was much smaller than that of the conventional magnetoresistive film. This is believed likely due to the higher Neel temperatures of respective antiferromagnetic materials, i.e., of the antimony-base alloys used in the present embodiments, relative to the Neel temperature of FeMn which is a conventionally-employed material. The Neel temperatures of those materials are listed below.

FeMn: 478 K (205° C.)
CrSb: 720 K (447° C.)
$FeSb_2$: 773 K (500° C.)
$(Mn_{0.2}Cr_{0.8})_{50}Sb_{50}$: 600 K(327° C.)

Figure 3:
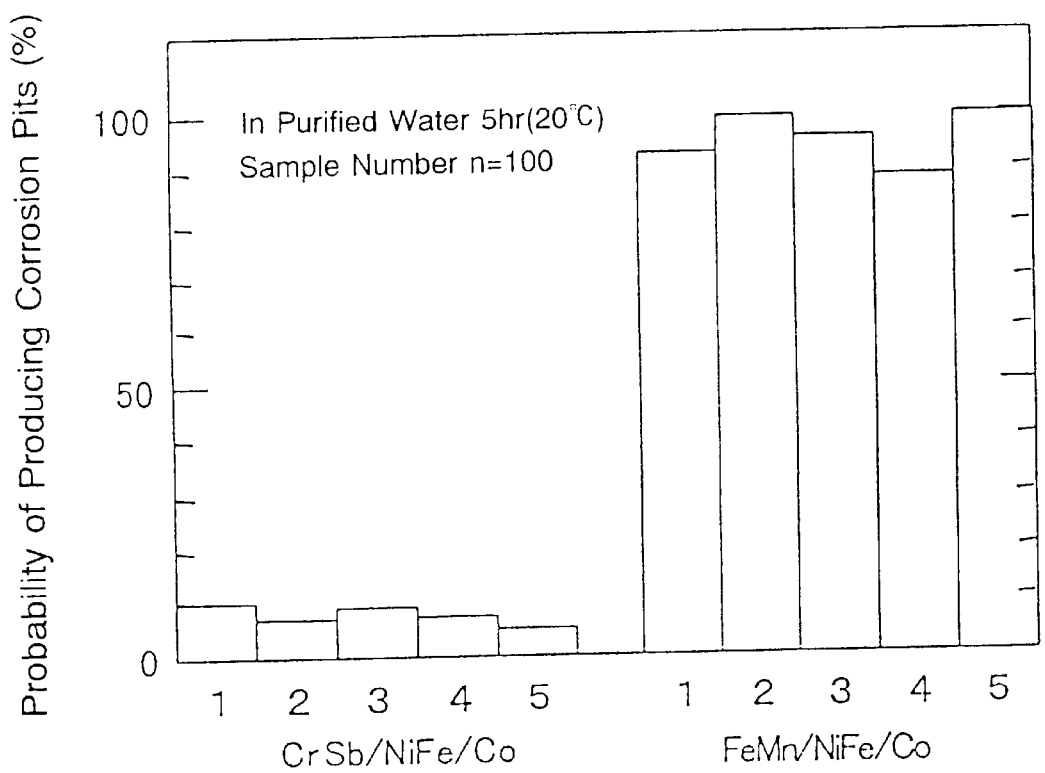
FIG. 3 is a graph showing a corrosion resistance of an antiferromagnetic layer employed in the embodiments in accordance with the first aspect of the present invention.

Also, each of the antiferromagnetic materials used in the present embodiments was evaluated for its corrosion resistance. A Co layer, an NiFe layer and a CrSb layer were formed on a silicone substrate in such a stacked order to prepare a sample thin film for evaluation of corrosion resistance. The results are shown in FIG. 3. For comparative purposes, a Co layer, an NiFe layer and an FeMn layer were formed on a silicone substrate in such a stacked order to prepare a comparative sample thin film for evaluation of its corrosion resistance. A film thickness of each layer was identical to that of the corresponding layer in the embodiments shown in FIGS. 1 and 2. One hundred samples were immersed into purified water at 20° C. for 5 hours. After removal from the purified water, they were placed under observation with a scanning electron microscope (SEM). The number of samples which produced corrosion pits was counted to determine a probability (%) of producing corrosion pits. As apparent from FIG. 3, the antiferromagnetic CrSb layer exhibits highly improved corrosion resistance relative to the conventional FeMn layer.

Figure 4:
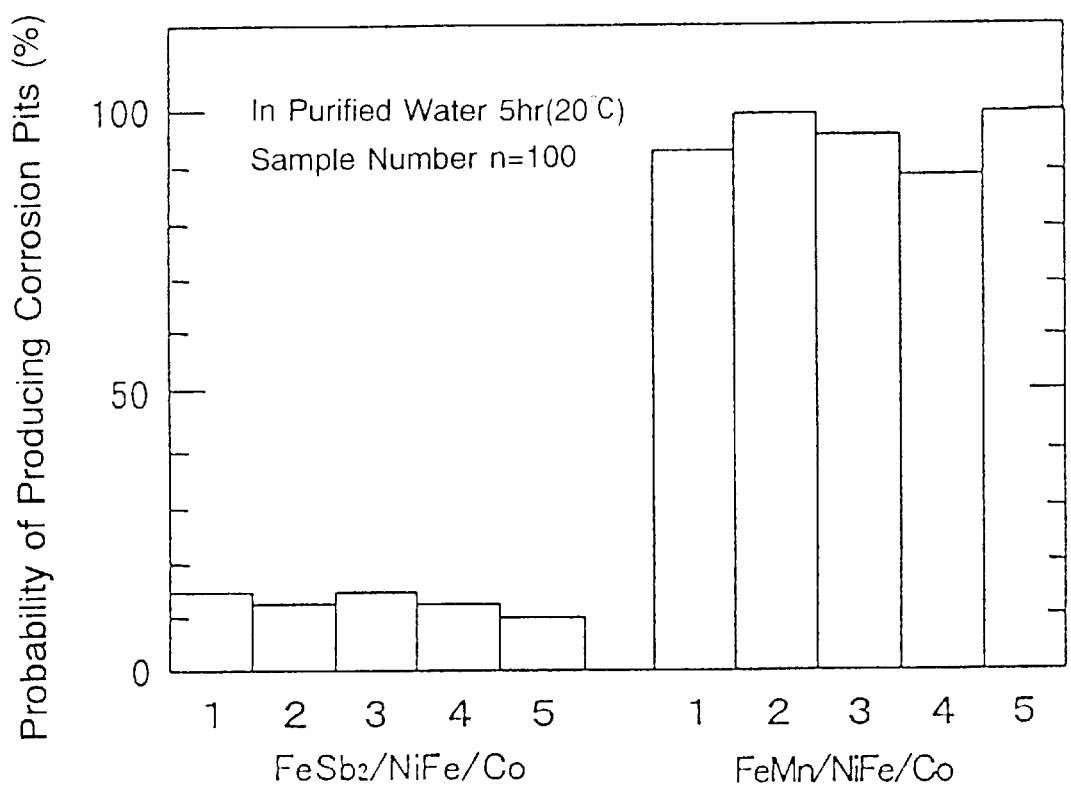
FIG. 4 is a graph showing a corrosion resistance of an antiferromagnetic layer employed in the embodiments in accordance with the first aspect of the present invention.
Figure 5:
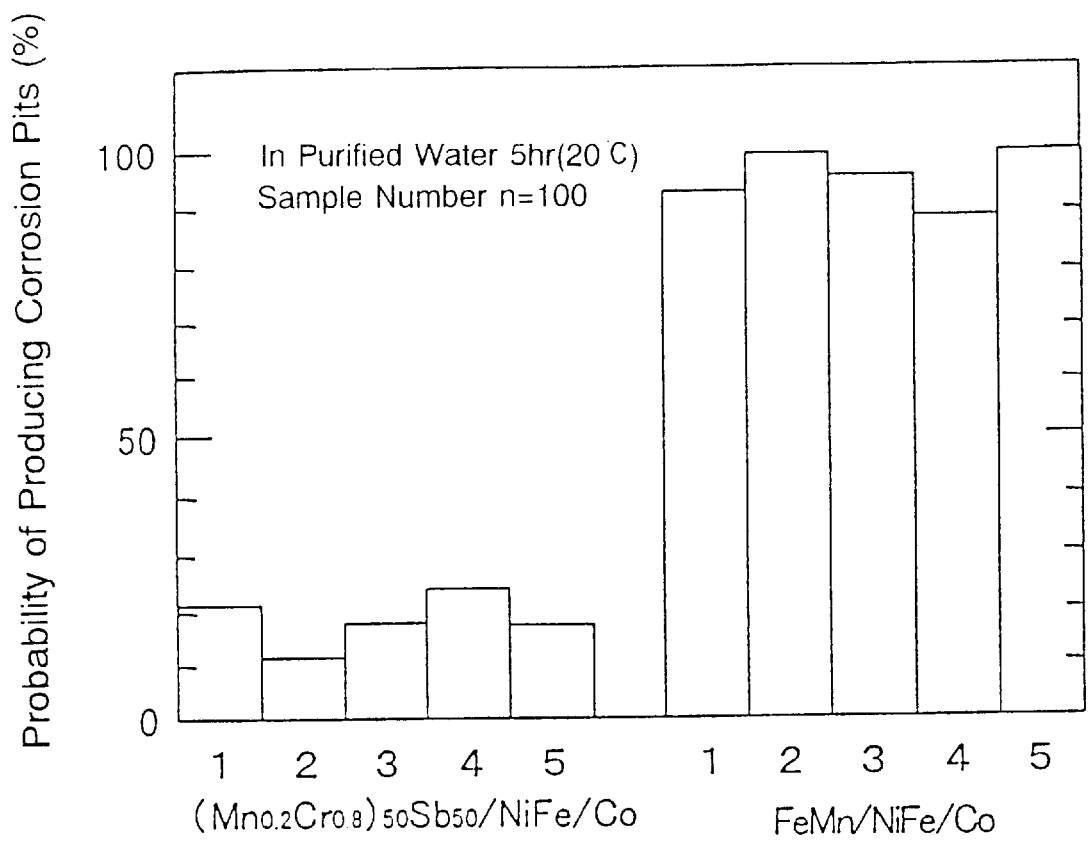
FIG. 5 is a graph showing a corrosion resistance of an antiferromagnetic layer employed in the embodiments in accordance with the first aspect of the present invention.

Similarly, sample thin films were prepared using $FeSb_2$ and $(Mn_{0.2}Cr_{0.8})_{50}Sb_{50}$, respectively, for the antiferromagnetic layer to measure the probabilities of producing corrosion pits. The results are given in FIGS. 4 and 5. As apparent from FIGS. 4 and 5, the antiferromagnetic layers used in the respective embodiments in accordance with the first aspect of the present invention exhibit highly improved corrosion resistance relative to the conventional FeMn layer.

Figure 6:
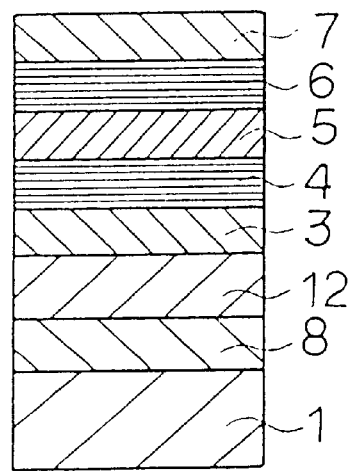
FIG. 6 is a cross-sectional view showing one embodiment of a magnetoresistive film in accordance with a second aspect of the present invention.

FIG. 6 is a cross-sectional view of one magnetoresistive film embodiment in accordance with a second aspect of the present invention. Formed on a glass substrate 1 is an underlayer 8 upon which is formed an antiferromagnetic layer 12 (film thickness: 5 nm) of $CoF_3$ or $FeF_3$. Additional layers are formed on the antiferromagnetic layer 12, as analogous to the embodiment of FIG. 1, to constitute the magnetoresistive film. Since the layers excluding the antiferromagnetic layer 12 are analogous to those in the embodiment of FIG. 1, like reference numerals are denoted to those like layers to omit the explanation thereof.

Figure 7:
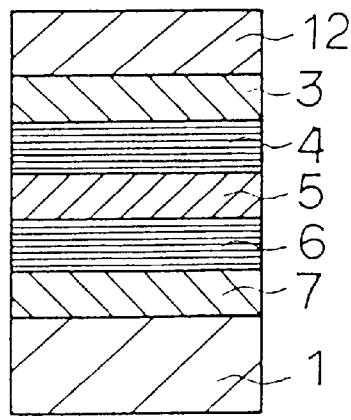
FIG. 7 is a cross-sectional view showing another embodiment of a magnetoresistive film in accordance with the second aspect of the present invention.

FIG. 7 is a cross-sectional view of another magnetoresistive film embodiment in accordance with the second aspect of the present invention. As shown in FIG. 7, in this embodiment, the stacked order of the layers 12 and 3 through 7 in the magnetoresistive film embodiment of FIG. 6 is reversed so that the antiferromagnetic layer 12 defines the upper-most layer. Since the antiferromagnetic layer 12 is the upper-most layer in this embodiment, the underlayer 8 is omitted, as contrary to the embodiment of FIG. 6 wherein the underlayer 8 is formed on the substrate 1.

Two types of layers, i.e., a $CoF_3$ layer and an $FeF_3$ layer were employed as the antiferromagnetic layer 12 to prepare the magnetoresistive films respectively shown in FIG. 6 and 7 for measurement of their MR characteristics. The prepared magnetoresistive films exhibited the MR characteristics either comparable or superior to the conventional magnetoresistive film incorporating the FeMn layer as the antiferromagnetic layer.

Figure 8:
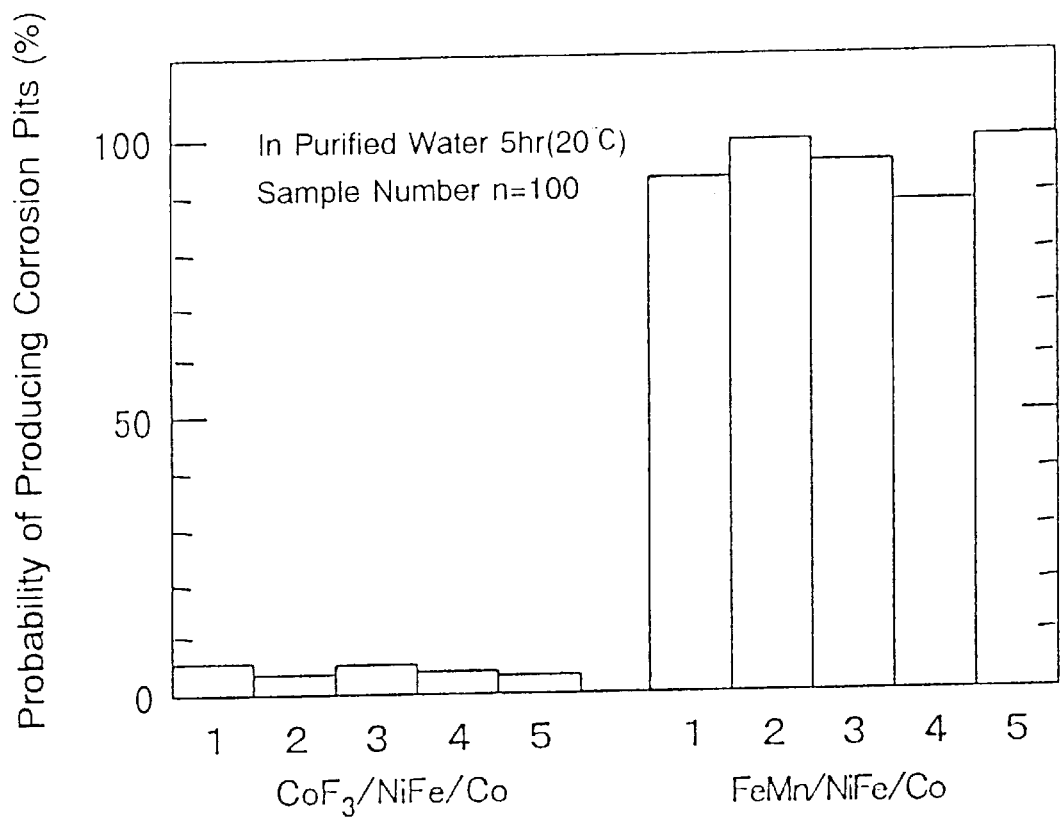
FIG. 8 is a graph showing a corrosion resistance of an antiferromagnetic layer employed in the embodiments in accordance with the second aspect of the present invention.
Figure 9:
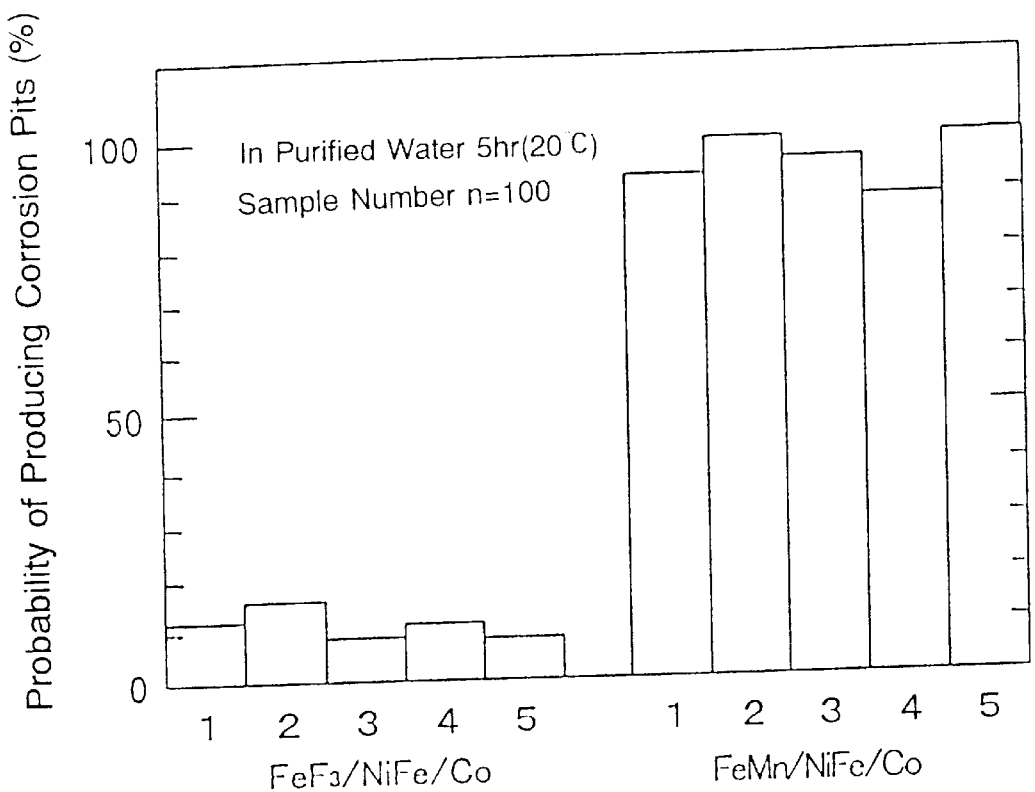
FIG. 9 is a graph showing a corrosion resistance of an antiferromagnetic layer employed in the embodiments in accordance with the second aspect of the present invention.

As similar to the above, a $CoF_3$ layer and an $FeF_3$ layer as the antiferromagnetic layer were respectively stacked on a two-layer film including Co and NiFe layers to prepare sample films for measurement of probabilities of producing corrosion pits. The results are shown in FIGS. 8 and 9. FIG. 8 shows the measurement results for the $CoF_3$ layer. FIG. 9 shows the measurement results for the $FeF_3$ layer. As apparent from FIGS. 8 and 9, the antiferromagnetic $CoF_3$ and $FeF_3$ layers both exhibit highly improved corrosion resistance relative to the conventional antiferromagnetic FeMn layer.

Figure 10:
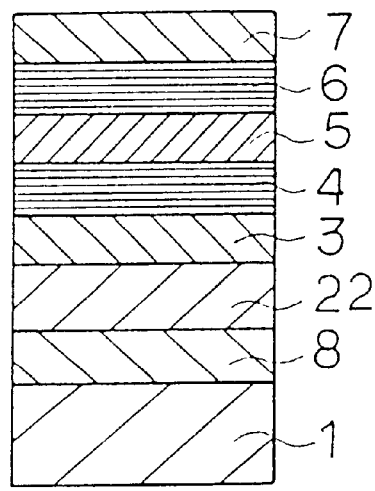
FIG. 10 is a cross-sectional view showing one embodiment of a magnetoresistive film in accordance with a third aspect of the present invention.

FIG. 10 is a cross-sectional view of one magnetoresistive film embodiment in accordance with a third aspect of the present invention. As shown in FIG. 10, formed on a substrate 1 is an underlayer 8 upon which is formed an antiferromagnetic layer 22 (film thickness: 5 nm) of $Fe_{50}Rh_{35}Pd_{15}$. Additional layers are formed on the antiferromagnetic layer 22, as analogously to the embodiment of FIG. 1, to constitute the magnetoresistive film. Since the layers excluding the antiferromagnetic layer 22 are analogous to those in the embodiment of FIG. 1, like reference numerals are denoted to those like layers to omit the explanation thereof.

Figure 11:
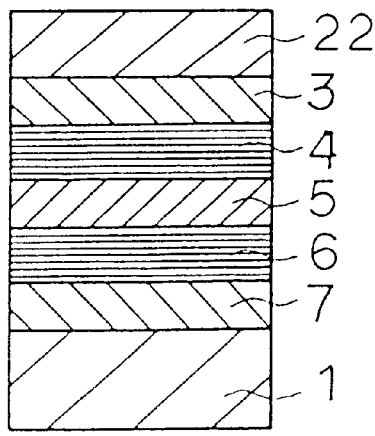
FIG. 11 is a cross-sectional view showing another embodiment of a magnetoresistive film in accordance with the third aspect of the present invention.

FIG. 11 is a cross-sectional view of another magnetoresistive film embodiment in accordance with the third aspect of the present invention. In this embodiment, the stacked order of the layers 22 and 3 through 7 in the magnetoresistive film embodiment of FIG. 10 is reversed so that the antiferromagnetic layer 22 defines an upper-most layer. The NiFe layer 7 is directly formed on the substrate 1 to omit the underlayer 8, as contrary to the embodiment of FIG. 10 wherein the underlayer 8 is formed on the substrate 1.

The magnetoresistive film embodiments of FIGS. 10 and 11 were measured for their respective MR characteristics. They exhibited the MR characteristics either comparable or superior to the conventional magnetoresistive film incorporating the FeMn layer as the antiferromagnetic layer.

Figure 12:
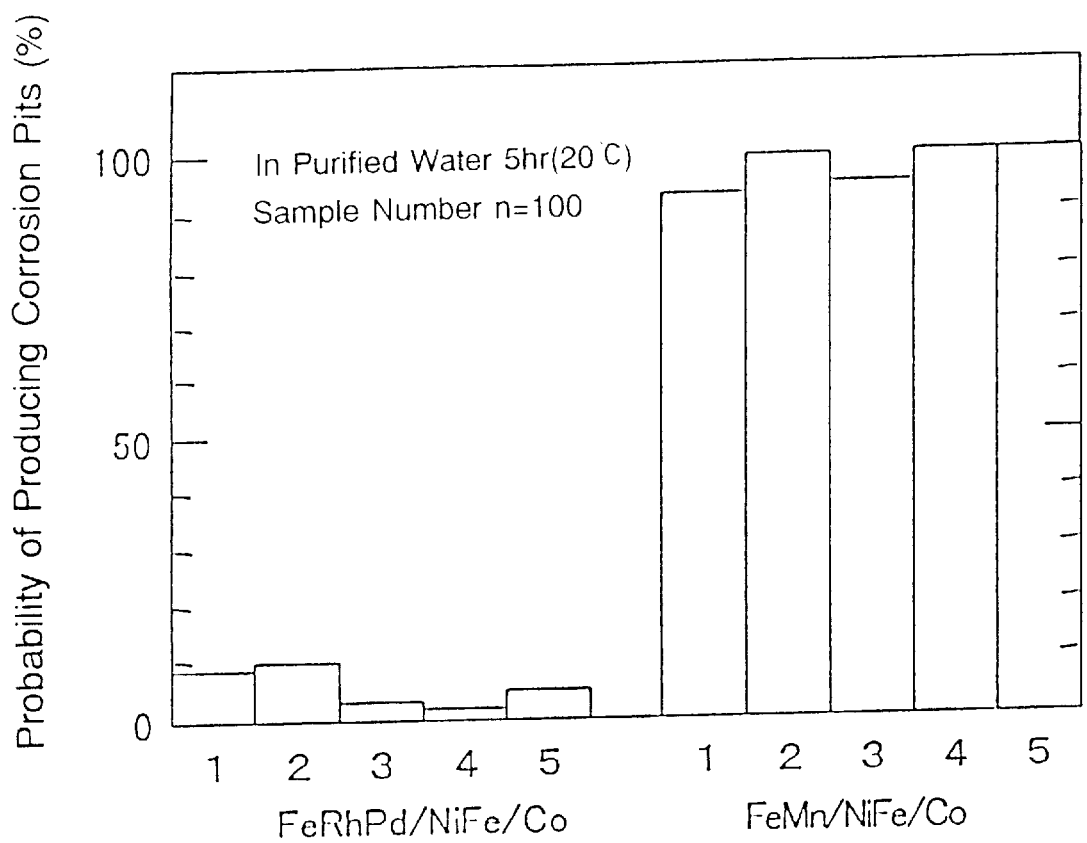
FIG. 12 is a graph showing a corrosion resistance of an antiferromagnetic layer employed in the embodiments in accordance with the third aspect of the present invention.

A sample of the magnetoresistive film embodiments was prepared in the manner as described above to measure the probability of producing corrosion pits. The results are shown in FIG. 12. As apparent from FIG. 12, the $Fe_{50}Rh_{35}Pd_{15}$ layer used in the present embodiment as the antiferromagnetic layer exhibits highly improved corrosion resistance relative to the conventional FeMn layer.

Figure 13:
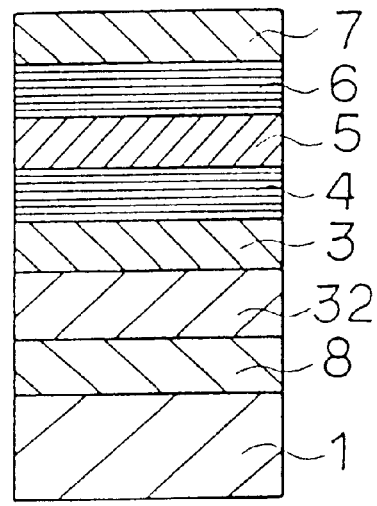
FIG. 13 is a cross-sectional view showing one embodiment of a magnetoresistive film in accordance with a fourth aspect of the present invention.

FIG. 13 is a cross-sectional view of one magnetoresistive film embodiment in accordance with a fourth aspect of the present invention. As shown in FIG. 13, formed on a glass substrate 1 is an underlayer 8 upon which is formed an antiferromagnetic layer 32 (film thickness: 5 nm) of FeS. Additional layers are formed on the antiferromagnetic layer 32, as analogously to the embodiment of FIG. 1, to constitute the magnetoresistive film. Since the layers excluding the antiferromagnetic layer 32 are analogous to those in the embodiment of FIG. 1, like reference numerals are denoted to those like layers to omit the explanation thereof.

Figure 14:
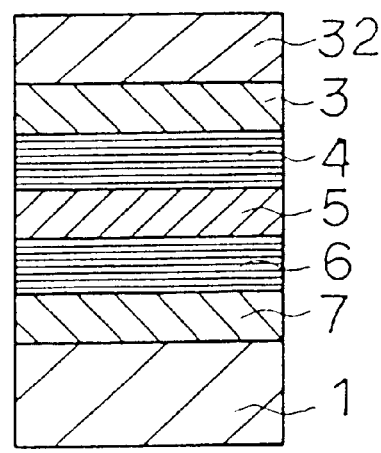
FIG. 14 is a cross-sectional view showing another embodiment of a magnetoresistive film in accordance with the fourth aspect of the present invention.

FIG. 14 is a cross-sectional view of another magnetoresistive film embodiment in accordance with the fourth aspect of the present invention. In this embodiment, the stacked order of the layers 32 and 3 through 7 in the magnetoresistive film embodiment of FIG. 13 is reversed so that the antiferromagnetic layer 32 defines an upper-most layer, as shown in FIG. 14. The NiFe layer 7 is directly formed on the substrate 1 to omit the underlayer 8.

The magnetoresistive film embodiments of FIGS. 13 and 14 were measured for their respective MR characteristics. They exhibited the MR characteristics either comparable or superior to the conventional magnetoresistive film incorporating the FeMn layer as the antiferromagnetic layer.

Also, the magnetoresistive film embodiments of FIGS. 13 and 14 as well as the conventional magnetoresistive film for comparison were respectively subjected to heat treatment at 260° C. for 10 hours for evaluation of their respective MR characteristics after heat treatment. Although the conventional magnetoresistive film incorporating the FeMn layer as the antiferromagnetic layer exhibited a marked reduction in MR characteristics, the magnetoresistive film embodiments including the FeS layer as the antiferromagnetic layer exhibited a slight reduction in MR characteristics. This is believed likely due to the higher Neel temperature of FeS, which is 613 K (340° C.), relative to the Neel temperature of FeMn, which is 478 K (205° C.).

Figure 15:
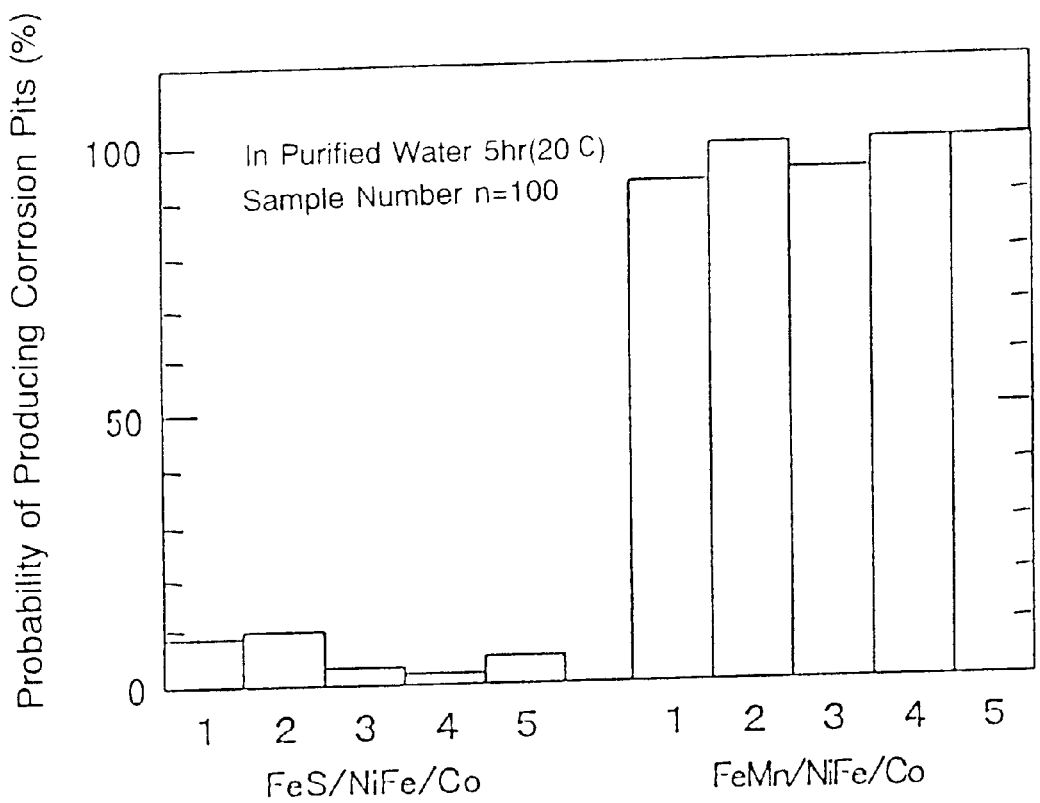
FIG. 15 is a graph showing a corrosion resistance of an antiferromagnetic layer employed in the embodiments in accordance with the fourth aspect of the present invention.

The antiferromagnetic layer of FeS was measured in the same manner as described above for its probability of producing corrosion pits. The results are shown in FIG. 15. As apparent from FIG. 15, it exhibited highly improved corrosion resistance relative to the conventional FeMn layer.

Figure 16:
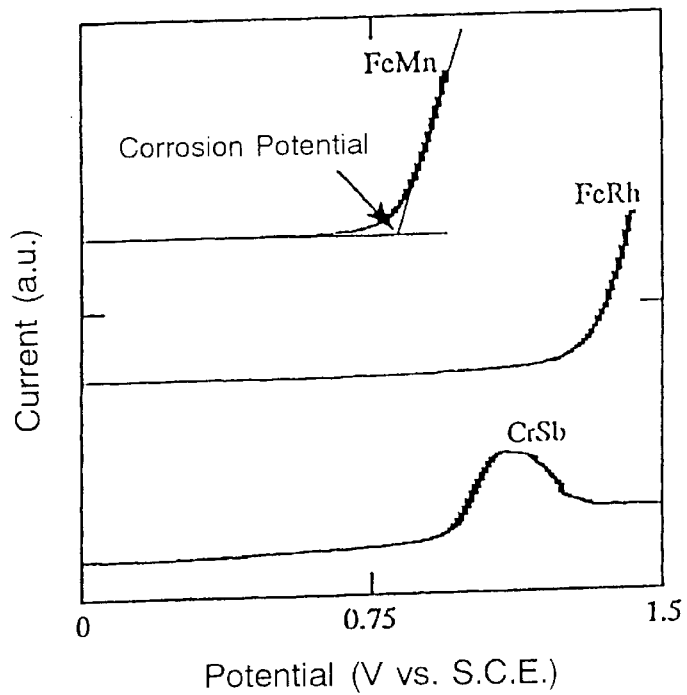
FIG. 16 is a graph showing current-potential curves of the antiferromagnetic films using a potentiostat.
Figure 17:
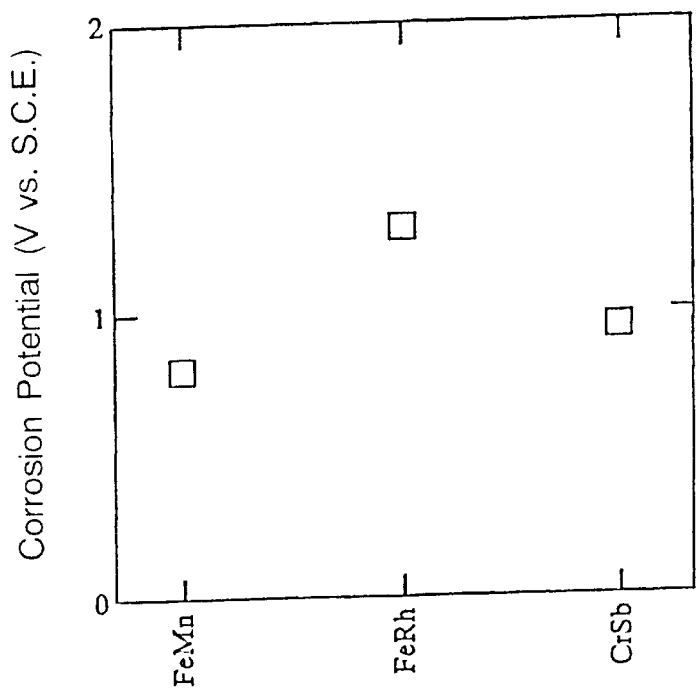
FIG. 17 is a graph showing a corrosion potential of each antiferromagnetic film.

FIG. 16 is a graph showing current-potential curves of the antiferromagnetic layer (film thickness: 50 nm) when measured with a potentiostat. FIG. 16 shows a current-potential curve of the conventional FeMn antiferromagnetic layer, and also shows current-potential curves of the FeRh and CrSb antiferromagnetic layers in accordance with the present invention. A corrosion potential of each material, which is indicative of its corrosion resistance level, was determined in the manner as shown on a data curve of FeMn in FIG. 16. As a potential continues to increase, a current starts to rise. A regression line is drawn to follow a slope of the rise in current. The intercept of this line on the X-axis is taken as the corrosion potential. FIG. 17 shows a corrosion potential of each material. As can be clearly seen from FIG. 17, FeRh and CrSb, which are employed for the antiferromagnetic layer in the present invention, exhibit higher corrosion potentials than FeMn, which has been employed for the conventional antiferromagnetic layer. This also demonstrates that the use of FeRh or CrSb for the antiferromagnetic layer can improve the corrosion resistance thereof.

Figure 18:
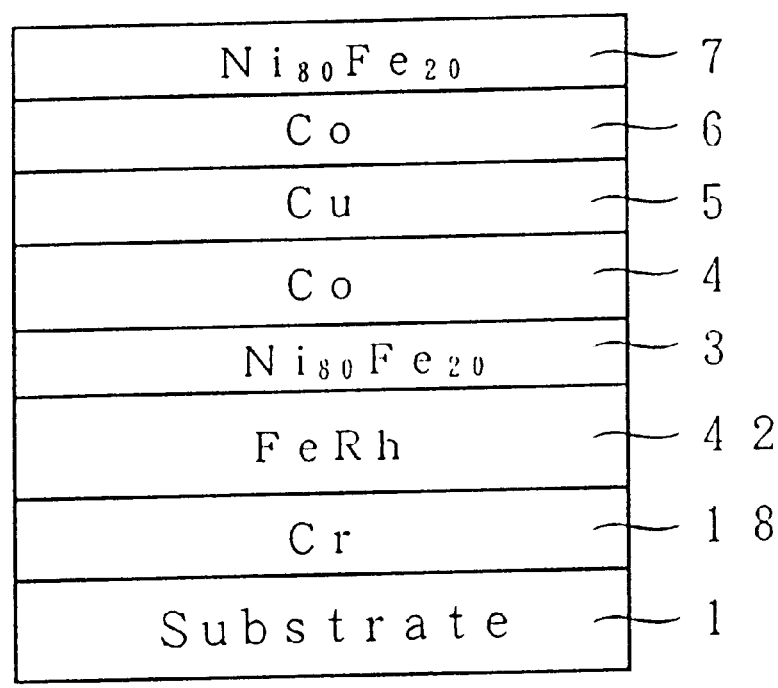
FIG. 18 is a cross-sectional view showing one embodiment of a magnetoresistive film in accordance with the third aspect and a seventh aspect of the present invention.

FIG. 18 is a cross-sectional view of one magnetoresistive film embodiment in accordance with the third aspect and a seventh aspect of the present invention. Referring to FIG. 18, an underlayer 18 (film thickness: 10 nm) of Cr, which is a material having a body-centered cubic structure, is formed on a glass substrate 1. Formed on the underlayer 18 is an antiferromagnetic layer 42 (film thickness: 50 nm) of FeRh which is an antiferromagnetic material having a body-centered cubic structure. As analogous to the above-described embodiments, formed on the antiferromagnetic layer 42 are an NiFe layer 3, a Co layer 4, a Cu layer 5, a Co layer 6 and an NiFe layer 7 in such a stacked order to constitute a spin valve magnetoresistive film. Here, FeRh for the antiferromagnetic layer 42 has a composition of $Fe_{50}Rh_{50}$.

Each layer is formed by means of an RF sputtering technique. An Ar gas pressure was set at 1 mTorr. while an RF power was set at 100 W. A substrate temperature was maintained at 150° C. or higher during film formation of the underlayer 18 and at room temperature during film formation of the other layers. A film forming rate was controlled at about 2–5 Å/sec.

Figure 19:
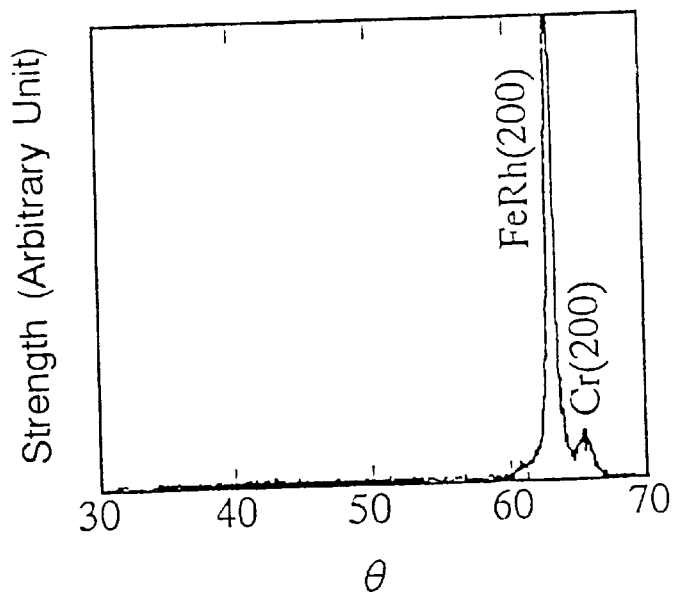
FIG. 19 is a graph showing an X-ray diffraction pattern for the embodiment shown in FIG. 18.
Figure 20:
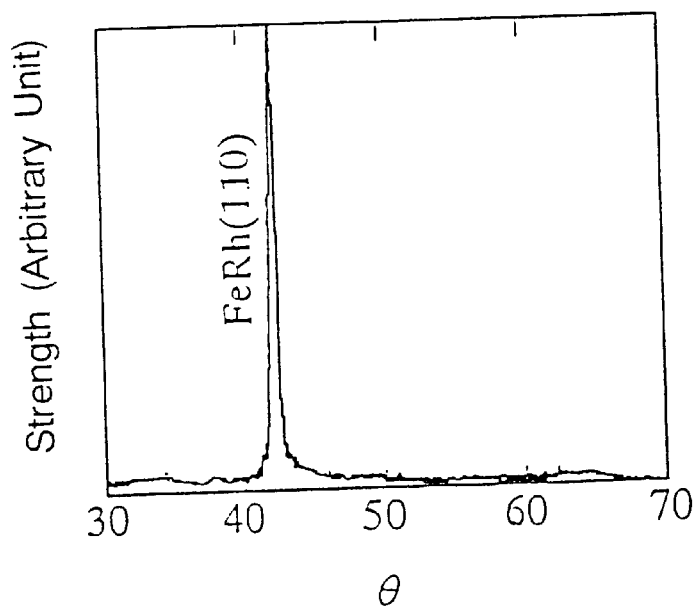
FIG. 20 is a graph showing an X-ray diffraction pattern for a comparative magnetoresistive film.

FIG. 19 is a graph showing an X-ray diffraction pattern of the layered film embodiment shown in FIG. 18. FIG. 20 is a graph showing an X-ray diffraction pattern of a comparative layered film in which the underlayer 18 is excluded from the embodiment of FIG. 18 to form the FeRh layer 42 directly on the substrate 1. As shown in FIG. 19, a peak of the (200) plane of the Cr underlayer and a peak of the (200) plane of FeRh appear in the spectrum. It is identified by this that the Cr layer is oriented in the (100) plane and the FeRh layer is oriented in the (100) plane. In general, a peak of the (100) plane is difficult to appear in the X-ray diffraction pattern. Thus, the orientation is identified by a peak of the (200) plane. On the other hand, in the comparative example wherein the Cr underlayer is excluded, the FeRh layer is oriented in the (110) plane as shown in FIG. 20.

Figure 21:
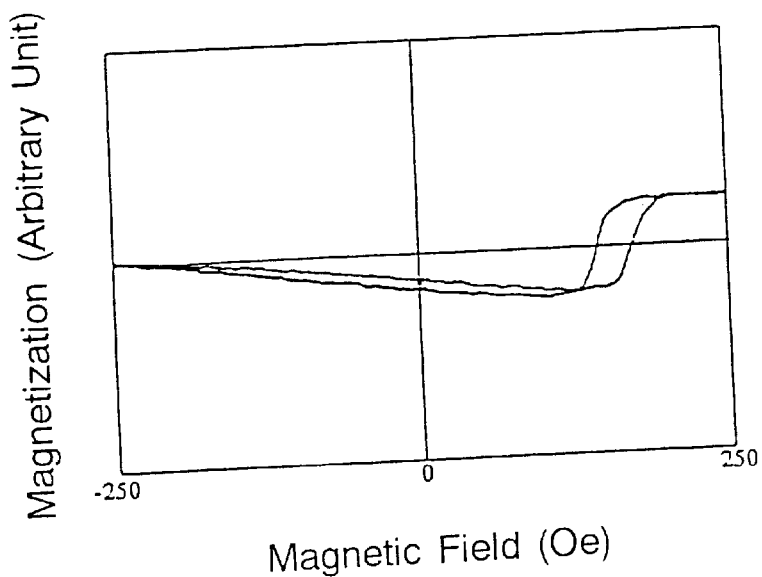
FIG. 21 is a graph showing M-H curves of a Cr—FeRh—NiFe multilayer film.
Figure 22:
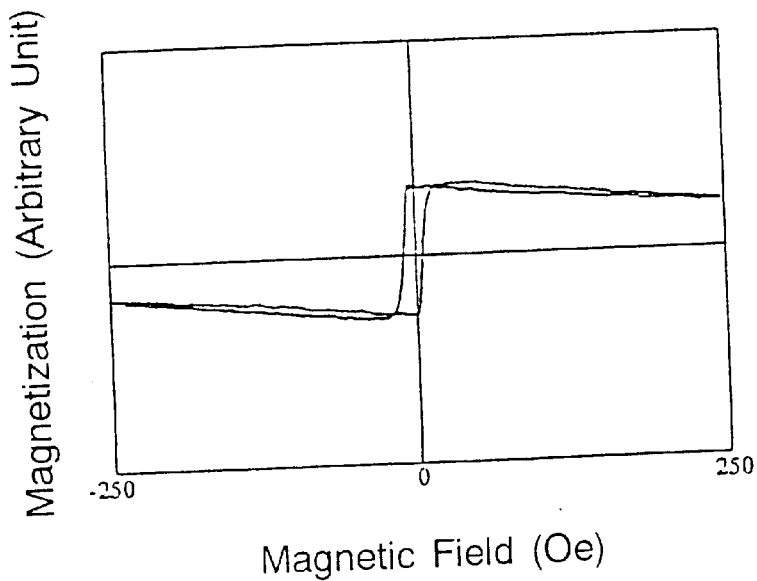
FIG. 22 is a graph showing M-H curves of a comparative magnetoresistive film.

FIG. 21 is a graph showing an M-H curve of a layered film comprised of Cr (10 nm)/FeRh (50 nm)/NiFe (5 nm). FIG. 22 is an M-H curve of a comparative layered film comprised of FeRh (50 nm)/NiFe (5 nm), which excludes the Cr layer and forms the FeRh layer directly on the substrate. As can be apparently seen from the comparison between FIGS. 21 and 22, the provision of the Cr underlayer results in the enhanced exchange coupling field of the antiferromagnetic and ferromagnetic layers.

Figure 23:
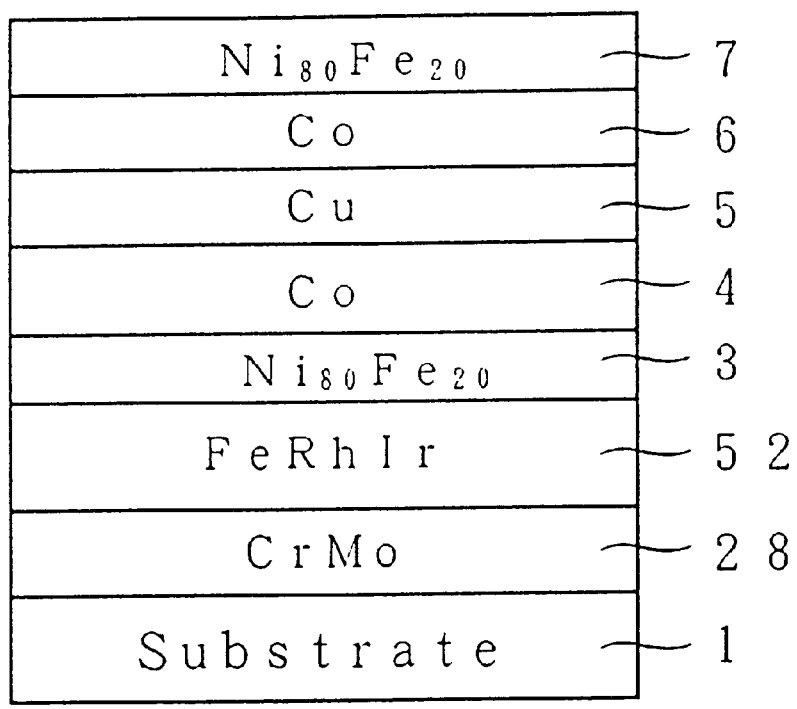
FIG. 23 is a cross-sectional view showing another embodiment of a magnetoresistive film in accordance with the third and seventh aspects of the present invention.

FIG. 23 is a cross-sectional view of another magnetoresistive film embodiment in accordance with the third and seventh aspects of the present invention. In this embodiment, an underlayer 28 (film thickness: 20 nm) of CrMo, which is a material having a body-centered cubic structure, is formed on a glass substrate 1. Formed on the underlayer 28 is an antiferromagnetic layer 52 (film thickness: 50 nm) of FeRhIr which is an antiferromagnetic material having a body-centered cubic structure. As analogous to the above embodiment of FIG. 18, formed on the antiferromagnetic layer 52 are an NiFe layer 3, a Co layer 4, a Cu layer 5, a Co layer 6 and an NiFe layer 7 in such a stacked order to constitute a spin valve magnetoresistive film. Here, FeRhIr for the antiferromagnetic layer 52 has a composition of $Fe_{50}Rh_{35}Ir_{15}$.

Each of the layers constituting the magnetoresistive film is formed by means of the RF sputtering technique, as analogously to the embodiment shown in FIG. 18.

Figure 24:
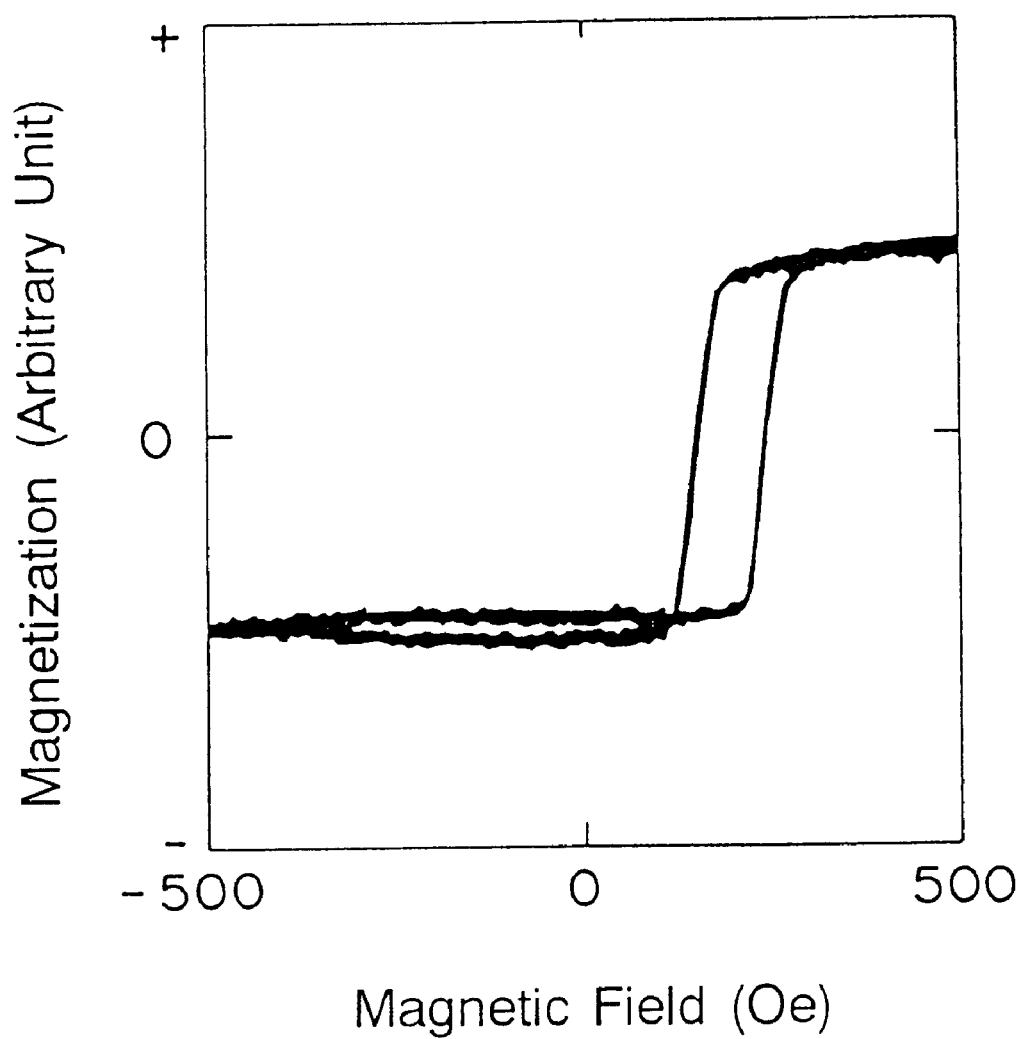
FIG. 24 is a graph showing M-H curves of a CrMo—FeRhIr—NiFe multilayer film.

FIG. 24 is a graph showing an M-H curve of a layered film comprised of CrMo (20 nm)/FeRhIr (50 nm)/NiFe (5 nm). As can be apparently seen from FIG. 24, again in this embodiment, a large exchange coupling field is produced between the antiferromagnetic and ferromagnetic layers.

Figure 25:
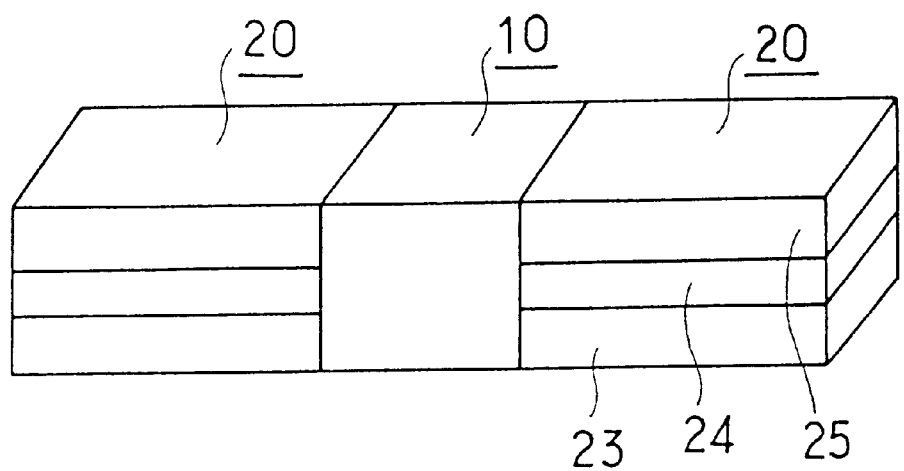
FIG. 25 is a cross-sectional view showing one embodiment of a magnetoresistive element in accordance with an eighth aspect of the present invention.

FIG. 25 is a perspective view showing one embodiment of the magnetoresistive element in accordance with an eighth aspect of the present invention. In the magnetoresistive element of the present invention, a domain control film 20 for controlling a magnetic domain of the magnetoresistive film 10 is disposed at each side of the magnetoresistive film 10. This domain control film 20 has a layered structure including the ferromagnetic layer 25 formed on the antiferromagnetic layer 24. In this particular embodiment, the domain control film 20 further includes an underlayer 23 disposed beneath the antiferromagnetic layer 24. The underlayer 23 and the antiferromagnetic layer 24 are both formed of a material having a body-centered cubic structure. In this embodiment, the underlayer 23 is comprised of a CrMo layer (film thickness: 20 nm) while the antiferromagnetic layer 24 is comprised of an FeRhIr layer (film thickness: 50 nm). The ferromagnetic layer 25 comprises an NiFe layer (film thickness: 20 nm).

Due to the presence of the underlayer 23, the antiferromagnetic layer 24 in the domain control film 20 of the present invention is also oriented in the (100) plane, as similar to the embodiments respectively shown in FIGS. 18 and 23. Accordingly, a large exchange coupling field is produced between the antiferromagnetic layer 24 and the ferromagnetic layer 25. As a result, a large bias field can be stably applied to the magnetoresistive film 10 to thereby enable an improved control of the magnetic domain.

Also, in the case where the magnetoresistive film 10 is the magnetoresistive film in accordance with the seventh aspect of the present invention and is the spin valve magnetoresistive film which includes an underlayer of material having a body-centered cubic structure, an antiferromagnetic layer of material having a body-centered cubic structure, a first ferromagnetic layer, a nonmagnetic conductive layer and a second ferromagnetic layer in such a stacked order, the underlayer of the magnetoresistive film 10 and the underlayer 23 of the domain control film 20 can be formed of the same material. In addition, the antiferromagnetic layer of the magnetoresistive film 10 and the antiferromagnetic layer 24 of the domain control film 20 can also be formed of the same material. In such a case, the underlayers respectively of the magnetoresistive film 10 and the domain control film 20 can be formed through the same thin film formation process. Likewise, the antiferromagnetic layers respectively of the magnetoresistive film 10 and the domain control film 20 can be formed through the same thin film formation process. This enables a simplified and efficient formation thereof.

Also, in the magnetoresistive films in accordance with the seventh and eighth aspects, the above-described effects can be similarly obtained, if the antiferromagnetic layer is formed of a material having a body-centered tetragonal structure, or if a preferentially oriented crystal plane of the antiferromagnetic layer is the (001) plane.

Although the material types for the respective layers which constitute the magnetoresistive or domain control film are specifically described in the above embodiments, the present invention is not limited to those materials. Other materials can be suitably employed. Also in the embodiments which are not specifically illustrated as having the domain control film, it should be understood that the domain control film generally employed in magnetoresistive elements, e.g., a longitudinally or transversely biasing layer, can be further combined.

Figure 26:
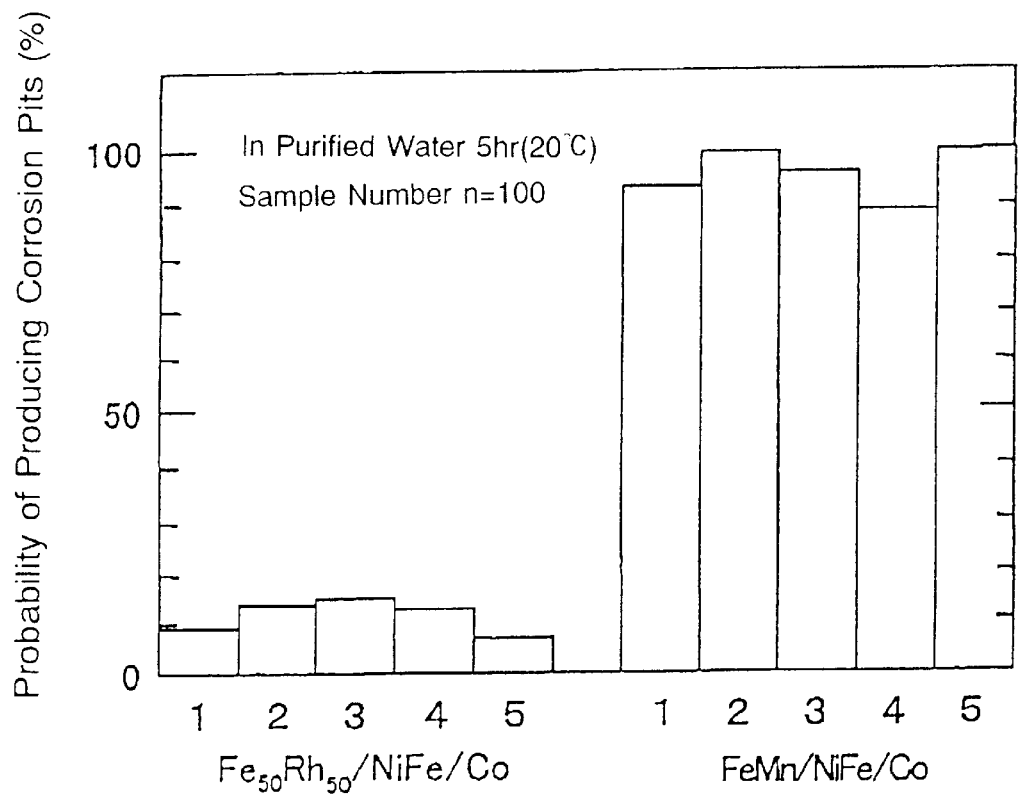
FIG. 26 is a graph showing a corrosion resistance of an antiferromagnetic layer employed in still another embodiment in accordance with the third aspect of the present invention.

FIG. 26 shows measurement results for probabilities that $Fe_{50}Rh_{50}$, employed as the antiferromagnetic layer in the third aspect of the present invention, produced corrosion pits. A sample film was prepared in the same manner as described above, i.e., by forming on a substrate a Co layer, an NiFe layer, and an antiferromagnetic layer as an object of measurement, in such a stacked order. As apparent from FIG. 26, the $Fe_{50}Rh_{50}$ layer used as the antiferromagnetic layer exhibits a remarkably superior corrosion resistance to the conventional FeMn layer.

Figure 27:
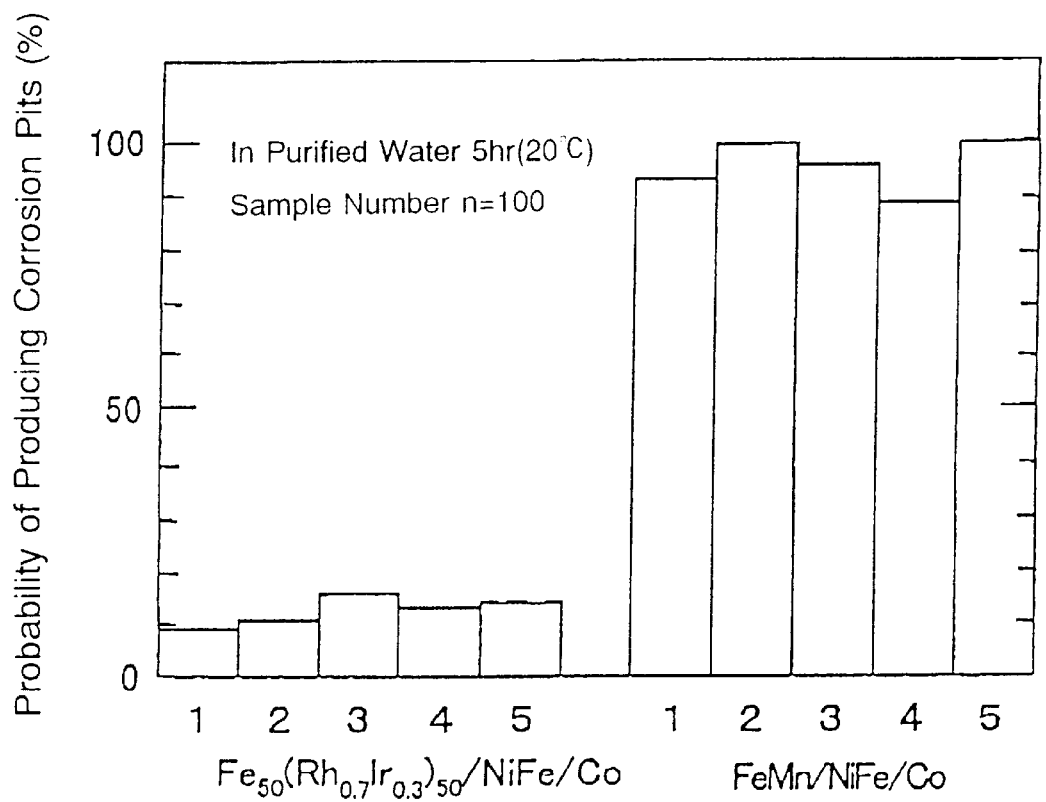
FIG. 27 is a graph showing a corrosion resistance of an antiferromagnetic layer employed in still another embodiment in accordance with the third aspect of the present invention.

FIG. 27 shows measurement results for probabilities that $Fe_{50}Rh_{35}Ir_{15}$, employed as the antiferromagnetic layer in the third aspect of the present invention, produced corrosion pits. As apparent from FIG. 27, the $Fe_{50}Rh_{35}Ir_{15}$ layer used as the antiferromagnetic layer exhibits a remarkably superior corrosion resistance to the conventional FeMn layer.

Figure 28:
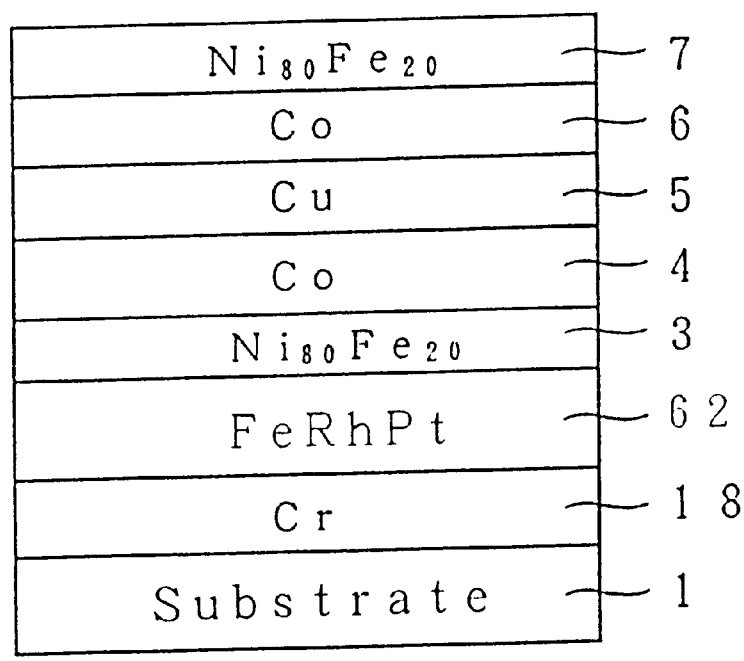
FIG. 28 is a cross-sectional view showing still another embodiment of a magnetoresistive film in accordance with the third and seventh aspects of the present invention.

FIG. 28 is a cross-sectional view of still another magnetoresistive film embodiment in accordance with the third and seventh aspects of the present invention. In this embodiment, an underlayer 18 (film thickness: 10 nm) of Cr, which is a material having a body-centered cubic structure, is formed on a glass substrate 1. Formed on the underlayer 18 is an antiferromagnetic layer 62 (film thickness: 50 nm) of FeRhPt which is an antiferromagnetic material having a body-centered cubic structure. As analogously to the embodiment shown in FIG. 18, formed on the antiferromagnetic layer 62 are an NiFe layer 3, a Co layer 4, a Cu layer 5, a Co layer 6 and an NiFe layer 7 in such a stacked order to constitute a spin valve magnetoresistive film. Here, FeRhPt employed for the antiferromagnetic layer 62 has a composition of $Fe_{50}Rh_{35}Pt_{15}$.

The formation of the FeRhPt layer having a body-centered cubic structure on the Cr layer 18 having a body-centered cubic structure, as analogously to the embodiment shown in FIG. 18, serves to provide stable and excellent magnetoresistive characteristics.

Figure 29:
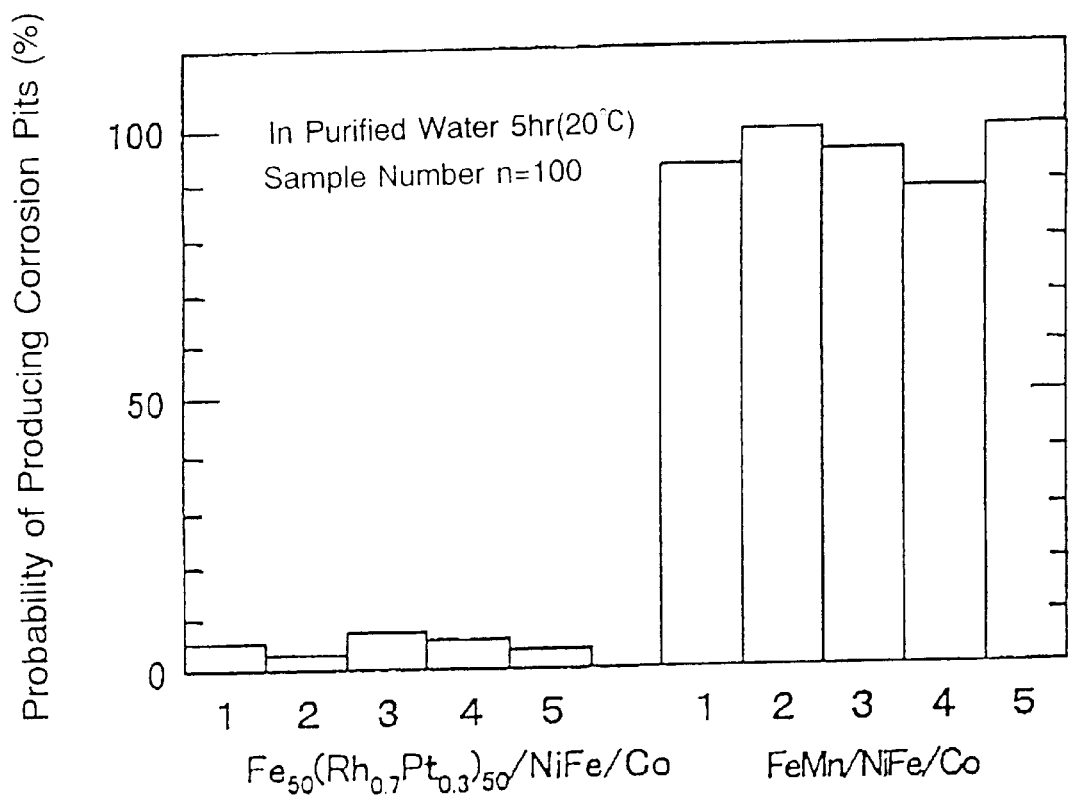
FIG. 29 is a graph showing a corrosion resistance of an antiferromagnetic layer employed in still another embodiment in accordance with the third aspect of the present invention.

FIG. 29 shows measurement results for probabilities that FeRhPt, employed as the antiferromagnetic layer in the third aspect of the present invention, produced corrosion pits. As apparent from FIG. 29, the FeRhPt layer exhibits a remarkably improved corrosion resistance relative to the conventional FeMn layer.

Figure 30:
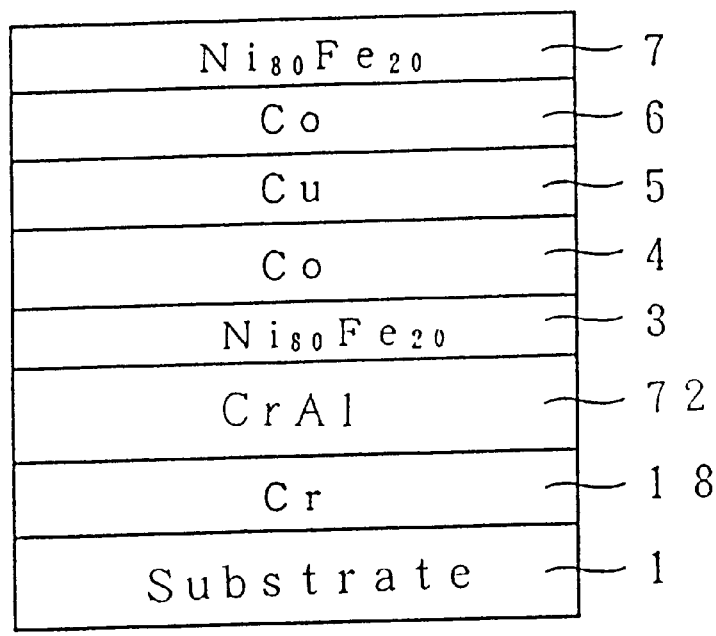
FIG. 30 is a cross-sectional view showing one embodiment of a magnetoresistive film in accordance with a fifth aspect of the present invention.

FIG. 30 is a cross-sectional view of one magnetoresistive film embodiment in accordance with a fifth aspect of the present invention. Referring to FIG. 30, an underlayer 18 (film thickness: 10 nm) of Cr, which is a material having a body-centered cubic structure, is formed on a glass substrate 1. Formed on the underlayer 18 is an antiferromagnetic layer 72 (film thickness: 50 nm) of CrAl which is an antiferromagnetic material. As analogously to the embodiment shown in FIG. 18, formed on the antiferromagnetic layer 72 are an NiFe layer 3, a Co layer 4, a Cu layer 5, a Co layer 6 and an NiFe layer 7 in such a stacked order to constitute a spin valve magnetoresistive film. Here, CrAlt employed for the antiferromagnetic layer 72 has a composition of $Cr_{60}Al_{40}$. As shown in FIG. 30, the CrAl antiferromagnetic layer in accordance with the fifth aspect of the present invention is preferably formed on an underlayer of a material having a body-centered cubic structure. An excellent crystallinity can be imparted to antiferromagnetic layer as formed on such an underlayer, resulting in stable and excellent magnetoresistive characteristics.

Figure 31:
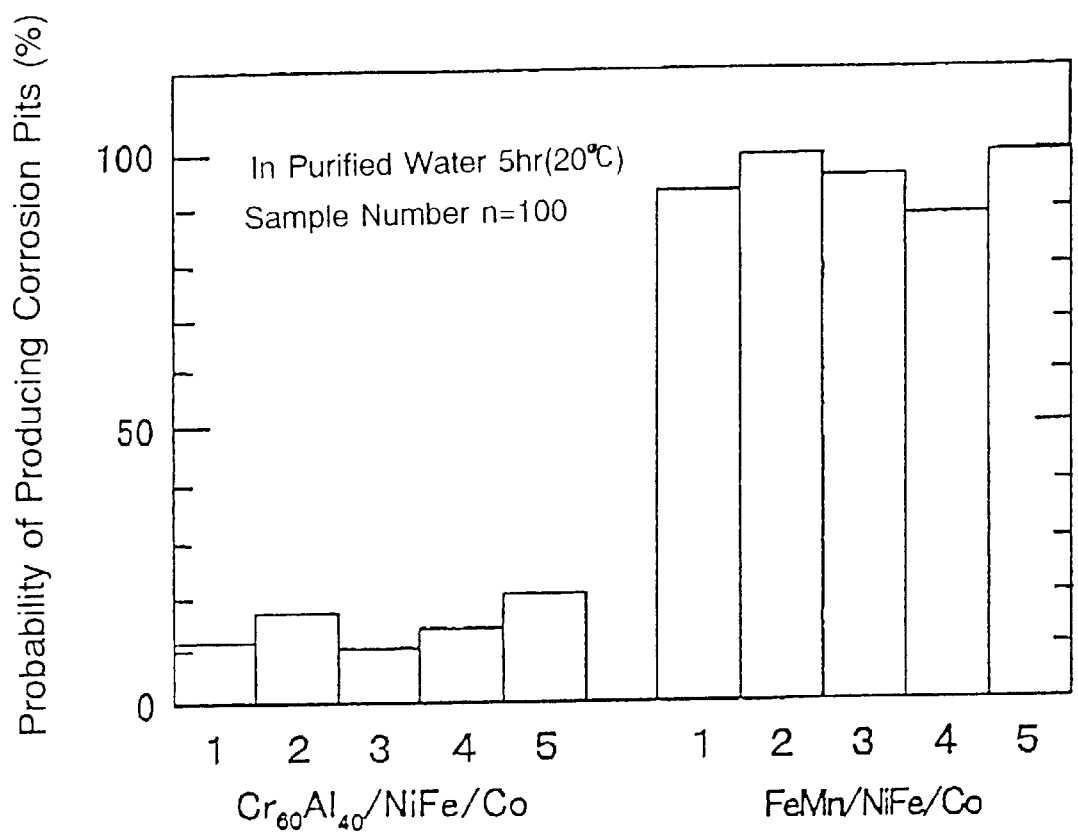
FIG. 31 is a graph showing a corrosion resistance of an antiferromagnetic layer employed in the one embodiment in accordance with the fifth aspect of the present invention.

FIG. 31 shows measurement results for probabilities that the antiferromagnetic layer of $Cr_{60}Al_{40}$ produced corrosion pits. As apparent from FIG. 31, the $Cr_{60}Al_{40}$ layer exhibits a remarkably improved corrosion resistance relative to the conventional FeMn layer.

Figure 32:
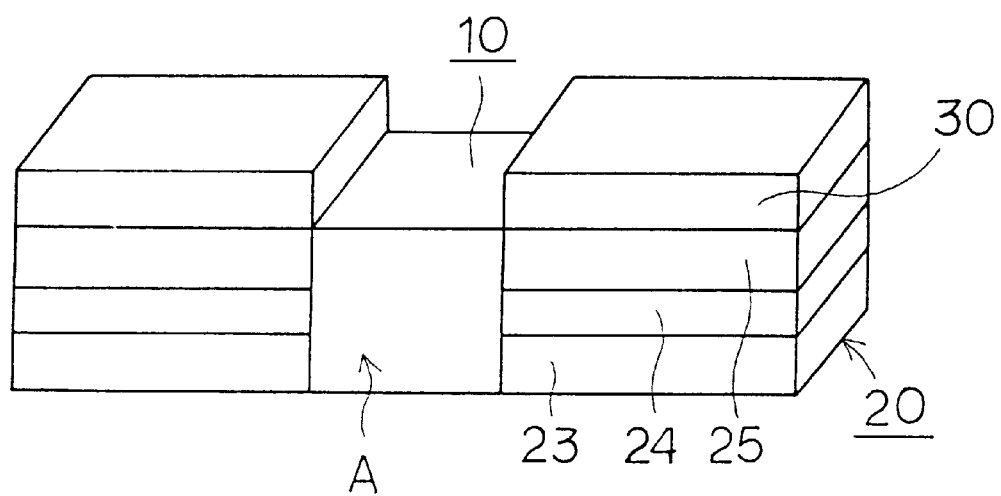
FIG. 32 is a perspective view showing one exemplary construction of a magnetoresistive element which incorporates a magnetoresistive film of the present invention.

FIG. 32 is a perspective view showing a magnetoresistive element construction to which the magnetoresistive film of the present invention is applied. The magnetoresistive element in accordance with the present embodiment includes a domain control film 20 at each side of a magnetoresistive film 10, as similar to the embodiment shown in FIG. 25. FIG. 32 also shows an electrode 30 provided on the domain control film 20. The electrode 30 is provided for supplying a current to the magnetoresistive film and for reading a voltage. The electrode 30 is made of Cu.

In the manner as described above, the magnetoresistive film 10, the domain control film 20 and others are formed on a substrate. Polishing is thereafter applied to define a surface corresponding to an air-bearing surface (ABS). The use of a low corrosion-resistant, antiferromagnetic layer generally results in corrosion thereof in the polishing process. The FeRh-base alloy antiferromagnetic layer in accordance with the third aspect and the CrAl-base alloy antiferromagnetic layer in accordance with the fifth aspect produce no corrosion pits even in such a polishing process, exhibiting a practically excellent corrosion resistance.

FIG. 33 is a cross-sectional view of one magnetoresistive film embodiment in accordance with a sixth aspect of the present invention. In this embodiment, a Ta underlayer 44 (film thickness: 6.5 nm) is formed on a glass substrate 43. Formed on the Ta underlayer 44 is a Co ferromagnetic layer 45 (film thickness: 5 nm), a Cu nonmagnetic conductive layer (film thickness: 2.5 nm) and a Co ferromagnetic layer 47 (film thickness: 3 nm). An IrMnCo antiferromagnetic layer 48 (film thickness: 15 nm) is formed on the Co ferromagnetic layer 47. A Ta layer 49 (film thickness: 5 nm) as a protective layer is formed on the IrMnCo antiferromagnetic layer 48.

In the sixth aspect of the present invention, Co is added to an IrMn-base alloy, which is generally poor in corrosion-resistance, to impart an improved corrosion resistance. The Co addition to the IrMn-base alloy is preferably not greater than 30 atomic percent, more preferably in the range of 0.1–20 atomic percent.

Figure 34:
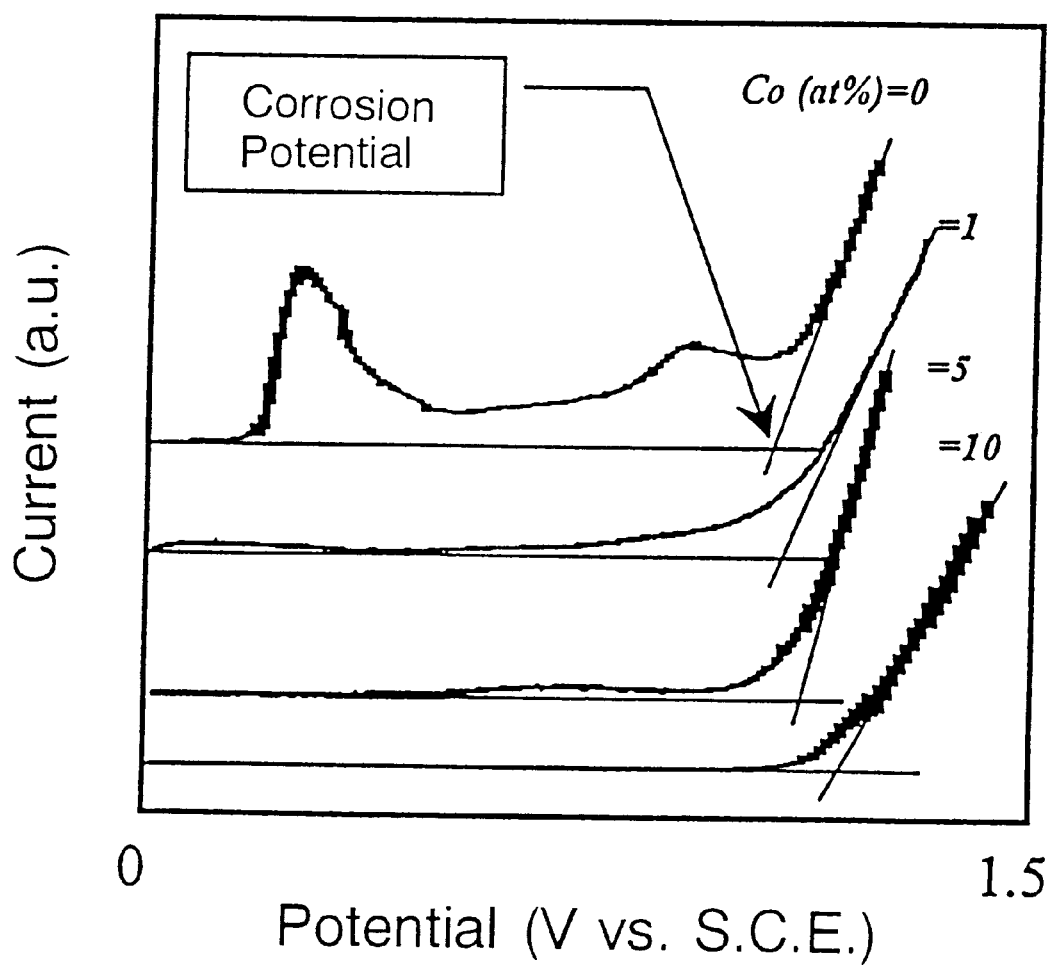
FIG. 34 is a graph showing current-potential curves of the antiferromagnetic films using a potentiostat.

FIG. 34 is a graph showing current-potential curves of an antiferromagnetic film when measured with a potentiostat. FIG. 34 shows measurement results for $Ir_{25}Mn_{75}$ antiferromagnetic layers to which 0, 1, 5 and 10 atomic percent of Co were respectively added. A sample film employed for measurement was prepared by forming each antiferromagnetic layer on a glass substrate to a thickness of 100 Å. As can be clearly seen from FIG. 34, as the Co addition in amount increases, the corrosion potential goes higher, resulting in more improved corrosion resistances.

Figure 35:
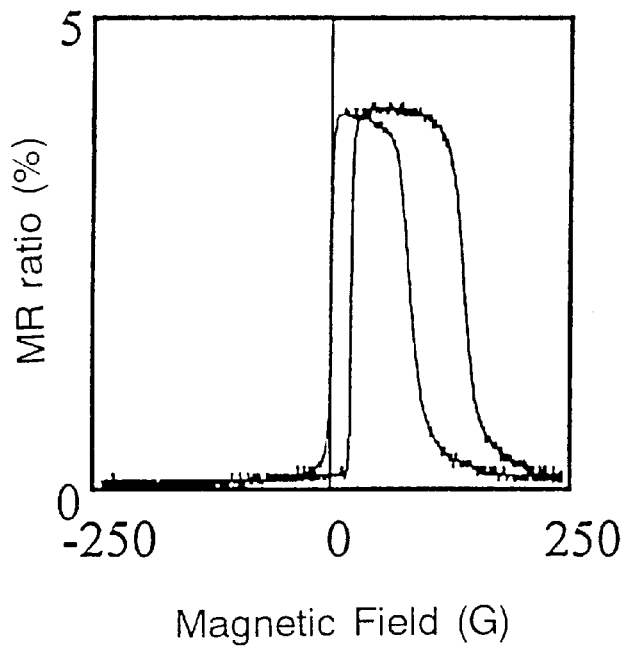
FIG. 35 is a graph showing MR characteristics of the one embodiment in accordance with the sixth aspect of the present invention.

FIG. 35 is a graph showing MR characteristics of the magnetoresistive film shown in FIG. 33 in which ($Ir_{25}Mn_{75}$)$_{90}Co_{10}$, i.e., the $Ir_{25}Mn_{75}$-base alloy to which 10 atomic percent of Co was added, was employed for the antiferromagnetic layer 48. Also, FIG. 36 is a graph showing MR characteristics of a comparative magnetoresistive film which employed $Ir_{25}Mn_{75}$ for the antiferromagnetic layer.

Figure 36:
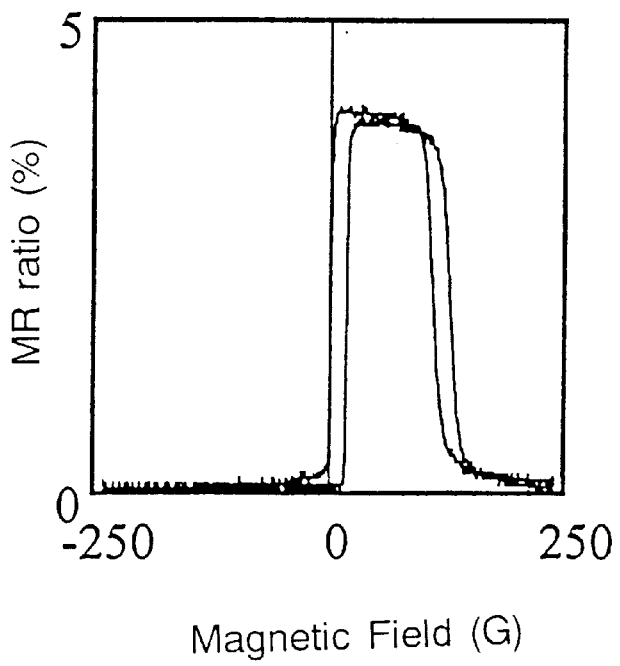
FIG. 36 is a graph showing MR characteristics of a comparative magnetoresistive film.

As apparent from the comparison between FIG. 35 and FIG. 36, in accordance with the sixth aspect of the present invention, the magnetoresistive film is provided to which the greatly improved corrosion resistance can be imparted without sacrificing the magnetoresistive characteristics.

In the embodiment shown in FIG. 33, the layers are illustrated to be stacked in the order of a ferromagnetic layer/nonmagnetic conductive layer/ferromagnetic layer/antiferromagnetic layer. Alternatively, such a stacked order may be reversed, i.e., they may be stacked in the order of an antiferromagnetic layer/ferromagnetic layer/nonmagnetic conductive layer/ferromagnetic layer. Also, a dual-type layered structure is applicable which, for example, comprises an antiferromagnetic layer/ferromagnetic layer/nonmagnetic conductive layer/ferromagnetic layer/nonmagnetic conductive layer/ferromagnetic layer/antiferromagnetic layer.

The magnetoresistive film of the present invention employs highly corrosion-resistant materials to form an antiferromagnetic layer, and therefore exhibits a very superior corrosion resistance to the conventional magnetoresistive films incorporating an FeMn layer as an antiferromagnetic layer.

Also, the magnetoresistive films in accordance with the first and fourth aspects of the present invention employ antiferromagnetic materials having higher Neel temperatures, and therefore exhibit superior heat-resistances to the conventional magnetroresistive films.

Also, the magnetoresistive film in accordance with the seventh aspect of the present invention provides an underlayer of a material having a body-centered cubic structure beneath an antiferromagnetic layer of a material having a body-centered cubic or tetragonal structure, and is therefore able to orient its crystal plane so that the antiferromagnetic and ferromagnetic layers produce a large exchange coupling field for exhibiting stable and excellent magnetoresistive characteristics.

Furthermore, the magnetoresistive element in accordance with the eighth aspect of the present invention provides an underlayer beneath an antiferromagnetic layer in a domain control film. The underlayer is formed of a material having a body-centered cubic structure while the antiferromagnetic layer is formed of a material having a body-centered cubic or tetragonal structure. Such a construction can impart a stable biasing field to a magnetoresistive film, resulting in a better domain control.

What is claimed is:

1. A magnetoresistive film having a layered structure, said layered structure comprising:
   a first ferromagnetic layer;
   a second ferromagnetic layer;
   a nonmagnetic conductive layer interposed between said first and second ferromagnetic layers; and
   an antiferromagnetic layer coupled with one of said first and second ferromagnetic layers;
   wherein said antiferromagnetic layer comprises an antiferromagnetic antimony-base alloy.

2. The magnetoresistive film of claim 1, said antiferromagnetic antimony-base alloy is CrSb, $FeSb_2$ or $(Mn_XCr_{1-X})_YSb_{100-Y}$ ($0 \leq X \leq 0.3$, $40 \leq Y \leq 60$).

3. The magnetoresistive film of claim 2, said antiferromagnetic antimony-base alloy is $(Mn_XCr_{1-X})_{50}Sb_{50}$ ($0 \leq X \leq 0.3$).

4. The magnetoresistive film of claim 1 further comprising an underlayer for the antiferromagnetic layer, said underlayer comprising at least one metallic material in the Group IVa, Group Va or Group VIa of the periodic table, or a metallic material having a bcc crystal structure.

5. The magnetoresistive film of claim 1, wherein said ferromagnetic layer comprises a layered film of an NiFe layer and a Co layer.

6. The magnetoresistive film of claim 1, wherein said nonmagnetic conductive layer is a Cu layer.

7. A magnetoresistive film having a layered structure, said layered structure comprising:
- a first ferromagnetic layer;
- a second ferromagnetic layer;
- a nonmagnetic conductive layer interposed between said first and second ferromagnetic layers; and
- an antiferromagnetic layer coupled with one of said first and second ferromagnetic layers;
- wherein said antiferromagnetic layer comprises an antiferromagnetic fluoride.

8. The magnetoresistive film of claim 7, said antiferromagnetic fluoride is $CoF_3$ or $FeF_3$.

9. The magnetoresistive film of claim 7 further comprising an underlayer for the antiferromagnetic layer, said underlayer comprising at least one metallic material in the Group IVa, Group Va or Group VIa of the periodic table, or a metallic material having a bcc crystal structure.

10. The magnetoresistive film of claim 7, wherein said ferromagnetic layer comprises a layered film of an NiFe layer and a Co layer.

11. The magnetoresistive film of claim 7, wherein said nonmagnetic conductive layer is a Cu layer.

12. A magnetoresistive film having a layered structure, said layered structure comprising:
- a first ferromagnetic layer;
- a second ferromagnetic layer;
- a nonmagnetic conductive layer interposed between said first and second ferromagnetic layers; and
- an antiferromagnetic layer coupled with one of said first and second ferromagnetic layers;
- wherein said antiferromagnetic layer comprises an FeRh-base alloy containing at least one metallic element selected from the group consisting of Pt, Ir, Pd, Zr, Nb, Hf, Ta, W, Re and Os.

13. The magnetoresistive film of claim 12, said FeRh-base alloy is $Fe_X(Rh_{1-Y}Pt_Y)_{100-X}$ ($40 \leq X \leq 60$, $0 < Y \leq 0.5$).

14. The magnetoresistive film of claim 12, said FeRh-base alloy is $Fe_X(Rh_{1-Y}Ir_Y)_{100-X}$ ($40 \leq X \leq 60$, $0 < Y \leq 0.5$).

15. The magnetoresistive film of claim 12, said FeRh-base alloy is $Fe_X(Rh_{1-Y}Pd_Y)_{100-X}$ ($40 \leq X \leq 60$, $0 < Y \leq 0.5$).

16. The magnetoresistive film of claim 12 further comprising an underlayer for the antiferromagnetic layer, said underlayer comprising at least one metallic material in the Group IVa, Group Va or Group VIa of the periodic table, or a metallic material having a bcc crystal structure.

17. The magnetoresistive film of claim 12, wherein said ferromagnetic layer comprises a layered film of an NiFe layer and a Co layer.

18. The magnetoresistive film of claim 12, wherein said nonmagnetic conductive layer is a Cu layer.

19. The magnetoresistive film having a layered structure, said layered structure comprising:
- a first ferromagnetic layer;
- a second ferromagnetic layer;
- a nonmagnetic conductive layer interposed between said first and second ferromagnetic layers; and
- an antiferromagnetic layer coupled with one of said first and second ferromagnetic layers;
- wherein said antiferromagnetic layer comprises $Fe_{50}Rh_{50-X}Pd_X$ ($0 < X \leq 30$).

20. The magnetoresistive film of claim 19 further comprising an underlayer for the antiferromagnetic layer, said underlayer comprising at least one metallic material in the Group IVa, Group Va or Group VIa of the periodic table, or a metallic material having a bcc crystal structure.

21. The magnetoresistive film of claim 19, wherein said ferromagnetic layer comprises a layered film of an NiFe layer and a Co layer.

22. The magnetoresistive film of claim 19, wherein said nonmagnetic conductive layer is a Cu layer.

23. A magnetoresistive film having a layered structure, said layered structure comprising:
- a first ferromagnetic layer;
- a second ferromagnetic layer;
- a nonmagnetic conductive layer interposed between said first and second ferromagnetic layers;
- an antiferromagnetic layer coupled with one of said first and second ferromagnetic layers; and
- an underlayer arranged beneath said antiferromagnetic layer;
- wherein said antiferromagnetic layer comprises FeS; and
- wherein said underlayer comprises at least one metallic material in the Group IVa, Group Va or Group VIa of the periodic table, or a metallic material having a bcc crystal structure.

24. The magnetoresistive film of claim 23, wherein said ferromagnetic layer comprises a layered film of an NiFe layer and a Co layer.

25. The magnetoresistive film of claim 23, wherein said nonmagnetic conductive layer is a Cu layer.

26. A magnetoresistive film having a layered structure, said layered structure comprising:
- a first ferromagnetic layer;
- a second ferromagnetic layer;
- a nonmagnetic conductive layer interposed between said first and second ferromagnetic layers; and
- an antiferromagnetic layer coupled with one of said first and second ferromagnetic layers;
- wherein said antiferromagnetic layer comprises an IrMnCo-base alloy.

27. The magnetoresistive film of claim 26, said IrMnCo-base alloy is $(IrMn)_{100-X}Co_X$ ($0 < X \leq 30$).

28. The magnetoresistive film of claim 27, said IrMnCo-base alloy is $(Ir_{25}Mn_{75})_{100-X}Co_X$ ($0 < X \leq 30$).

29. The magnetoresistive film of claim 26 further comprising an underlayer for the antiferromagnetic layer, said underlayer comprising at least one metallic material in the Group IVa, Group Va or Group VIa of the periodic table, or a metallic material having a bcc crystal structure.

30. The magnetoresistive film of claim 26, wherein said ferromagnetic layer comprises a layered film of an NiFe layer and a Co layer.

31. The magnetoresistive film of claim 26, wherein said nonmagnetic conductive layer is a Cu layer.

32. A magnetoresistive film having a layered structure, said layered structure comprising:
- a first ferromagnetic layer;
- a second ferromagnetic layer;
- a nonmagnetic conductive layer interposed between said first and second ferromagnetic layers; and an antiferromagnetic layer coupled with one of said first and second ferromagnetic layers;

wherein said antiferromagnetic layer comprises a CrAl-base alloy.

33. The magnetoresistive film of claim 32, said CrAl-base alloy is $Cr_XAl_{100-X}$ ($50 \leq X \leq 80$).

34. The magnetoresistive film of claim 32 further comprising an underlayer for the antiferromagnetic layer, said underlayer comprising at least one metallic material in the Group IVa, Group Va or Group VIa of the periodic table, or a metallic material having a bcc crystal structure.

35. The magnetoresistive film of claim 32, wherein said ferromagnetic layer comprises a layered film of an NiFe layer and a Co layer.

36. The magnetoresistive film of claim 32, wherein said nonmagnetic conductive layer is a Cu layer.

37. A magnetoresistive film having a layered structure, said layered structure comprising:

a first ferromagnetic layer;

a second ferromagnetic layer;

a nonmagnetic conductive layer interposed between said first and second ferromagnetic layers;

an antiferromagnetic layer coupled with one of said first and second ferromagnetic layers; and an underlayer provided beneath said antiferromagnetic layer;

wherein said antiferromagnetic layer comprises a material having a body-centered cubic or tetragonal structure, and wherein said underlayer comprises a material having a body-centered cubic structure.

38. The magnetoresistive film of claim 37, wherein said underlayer comprises Cr; an alloy of Cr and at least one element selected from Ta, Zr, Nb, fe, W, V, Mo, Hf, Cs and Rb; Ta; or an alloy of Ta and at least one element selected from Zr and Nb.

39. The magnetoresistive film of claim 37, wherein said antiferromagnetic layer comprises an alloy of at least one element selected from Fe, Mn and Cr and at least one element selected from Rh, Pd, Co, Ir, Pt, Ni, Sb and F.

40. The magnetoresistive film of claims 37, wherein a preferentially oriented crystal plane of said underlayer is a (100) plane.

41. The magnetoresistive film of claim 37, wherein a preferentially oriented crystal plane of said antiferromagnetic layer is a (100) plane or a (001) plane.

42. The magnetoresistive film of claim 37, wherein said underlayer is formed of Cr and said antiferromagnetic layer is formed of an FeRh-base alloy.

43. A magnetoresistive element comprising:

a magnetoresistive film; and a domain control film having a layered structure for controlling a magnetic domain of said magnetoresistive film, said layered structure including:
    an antiferromagnetic layer comprising a material having a body-centered cubic or tetragonal structure,
    a ferromagnetic layer provided on said antiferromagnetic layer, and
    an underlayer provided beneath said antiferromagnetic layer and comprising a material having a body-centered cubic structure.

44. The magnetoresistive element of claim 43, wherein said magnetoresistive film has a layered structure comprising:
    a first ferromagnetic layer;
    a second ferromagnetic layer;
    a nonmagnetic conductive layer interposed between said first and second ferromagnetic layers;
    an antiferromagnetic layer coupled with one of said first and second ferromagnetic layers; and
    an underlayer provided beneath said antiferromagnetic layer;
    wherein said antiferromagnetic layer comprises a material having a body-centered cubic or tetragonal structure, and wherein said underlayer comprises a material having a body-centered cubic structure; and wherein said underlayer of said magnetoresistive film and said underlayer of said domain control film are formed of the same underlayer material, and wherein said antiferromagnetic layer of said magnetoresistive film and said antiferromagnetic layer of said domain control film are formed of the same antiferromagnetic material.

45. The magnetoresistive film of claim 32, wherein said antiferromagnetic layer is stacked and arranged directly on and extends coextensively with said one of said ferromagnetic layers to which said antiferromagnetic layer is coupled.

* * * * *